(12) United States Patent
Kageyama et al.

(10) Patent No.: US 9,350,027 B2
(45) Date of Patent: May 24, 2016

(54) SEALING STRUCTURE AND FUEL CELL HAVING THE SEALING STRUCTURE

(75) Inventors: Kazuhiro Kageyama, Yokohama (JP);
Yasuhiro Numao, Yokosuka (JP);
Tomokatsu Himeno, Yokohama (JP);
Atsushi Miyazawa, Kamakura (JP);
Tsutomu Yamazaki, Yokohama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 105 days.

(21) Appl. No.: 13/131,706

(22) PCT Filed: Oct. 30, 2009

(86) PCT No.: PCT/JP2009/068651
§ 371 (c)(1),
(2), (4) Date: May 27, 2011

(87) PCT Pub. No.: WO2010/061711
PCT Pub. Date: Jun. 3, 2010

(65) Prior Publication Data
US 2011/0229791 A1    Sep. 22, 2011

(30) Foreign Application Priority Data

Nov. 28, 2008  (JP) ................... 2008-304983
Nov. 28, 2008  (JP) ................... 2008-305400

(51) Int. Cl.
*H01M 8/02* (2006.01)
*H01M 8/24* (2006.01)
(Continued)

(52) U.S. Cl.
CPC ........... *H01M 8/0228* (2013.01); *C23C 14/022* (2013.01); *C23C 14/025* (2013.01);
(Continued)

(58) Field of Classification Search
CPC ............ H01M 8/0228; H01M 8/0273; H01M 8/0282; H01M 8/0206; H01M 2008/1095; H01M 8/0284; H01M 8/0296; H01M 8/242; C23C 16/50; C23C 16/26; C23C 16/0236; C23C 16/0281; C23C 14/35; C23C 14/025; C23C 14/0605; C23C 14/022; C23C 28/343; C23C 28/322; Y02E 60/50
USPC .................. 429/400, 469, 467, 452, 443, 428
See application file for complete search history.

(56) References Cited

U.S. PATENT DOCUMENTS 6,001,481 A * 12/1999 Dearnaley et al. ............ 428/408
6,080,503 A *  6/2000 Schmid et al. ................ 429/483
(Continued)

FOREIGN PATENT DOCUMENTS

CA     2361325      *  1/2001  .............. H01M 8/02
CN     1833331 A       9/2006
(Continued)

OTHER PUBLICATIONS

Saito et al. (Journal of Applied Physics vol. 75 No. 9 1994 pp. 4744-4750).*
(Continued)

*Primary Examiner* — Patrick Ryan
*Assistant Examiner* — Aaron Greso
(74) *Attorney, Agent, or Firm* — Foley & Lardner LLP

(57) ABSTRACT

A sealing structure includes: components (1, 2, 11, 16, 21, 22, 33, 34, 44, 51, 52, 61, 62) respectively having sealing surfaces (8, 9, 14, 17, 30, 31, 42, 43, 49, 71, 72) on surfaces thereof facing each other; and a seal member (3, 18, 25, 37, 46, 50, 55, 65, 104, 105, 106, 140, 240) interposed between the sealing surfaces to make the sealing surfaces closely adhere to each other, and at least a hard carbon film (6, 7, 13, 28, 29, 40, 41, 48, 53, 54, 66, 67, 108, 120, 130, 220, 230, 320, 330, 430) is formed on one or both of the sealing surfaces.

20 Claims, 20 Drawing Sheets

(51) Int. Cl.

| | |
|---|---|
| C23C 14/02 | (2006.01) |
| C23C 14/06 | (2006.01) |
| C23C 14/35 | (2006.01) |
| C23C 16/02 | (2006.01) |
| C23C 16/04 | (2006.01) |
| C23C 16/26 | (2006.01) |
| C23C 16/50 | (2006.01) |
| C23C 28/00 | (2006.01) |
| H01M 8/10 | (2016.01) |

(52) U.S. Cl.
CPC .............. *C23C14/0605* (2013.01); *C23C 14/35* (2013.01); *C23C 16/0236* (2013.01); *C23C 16/0281* (2013.01); *C23C 16/04* (2013.01); *C23C 16/26* (2013.01); *C23C 16/50* (2013.01); *C23C 28/322* (2013.01); *C23C 28/343* (2013.01); *H01M 8/0273* (2013.01); *H01M 8/0276* (2013.01); *H01M 8/0282* (2013.01); *H01M 8/0284* (2013.01); *H01M 8/242* (2013.01); *H01M 8/0206* (2013.01); *H01M 2008/1095* (2013.01); *Y02E 60/50* (2013.01)

(56) References Cited

U.S. PATENT DOCUMENTS

| | | | |
|---|---|---|---|
| 6,942,941 B2 | 9/2005 | Blunk et al. | |
| 2001/0031346 A1* | 10/2001 | Iwamura | 428/212 |
| 2001/0051273 A1* | 12/2001 | Veerasamy | 428/408 |
| 2002/0009630 A1* | 1/2002 | Gao et al. | 429/34 |
| 2004/0005502 A1* | 1/2004 | Schlag | 429/245 |
| 2005/0031933 A1 | 2/2005 | Blunk et al. | |
| 2007/0184326 A1* | 8/2007 | Sompalli et al. | 429/35 |
| 2007/0238005 A1 | 10/2007 | Yagi et al. | |
| 2009/0214927 A1* | 8/2009 | Dadheech et al. | 429/34 |
| 2010/0196784 A1 | 8/2010 | Kimura et al. | |
| 2010/0274003 A1 | 10/2010 | Kim et al. | |
| 2011/0287336 A1 | 11/2011 | Himeno et al. | |

FOREIGN PATENT DOCUMENTS

| | | | | |
|---|---|---|---|---|
| EP | 2 357 655 A1 | | 8/2011 | |
| JP | 63-181455 A | | 7/1988 | |
| JP | 4-330796 A | | 11/1992 | |
| JP | 3201124 B2 | * | 8/2001 | ............. G01N 27/37 |
| JP | 2002-134129 A | | 5/2002 | |
| JP | 2002-170582 A | | 6/2002 | |
| JP | 2004-284121 A | | 10/2004 | |
| JP | 2005-61426 A | | 3/2005 | |
| JP | 2005-93172 A | | 4/2005 | |
| JP | 2006-107862 A | | 4/2006 | |
| JP | 2007-501500 A | | 1/2007 | |
| JP | 2007012300 | * | 1/2007 | ............. H01M 8/02 |
| JP | 2007-305573 A | | 11/2007 | |
| JP | 2007-314838 A | | 12/2007 | |
| JP | 2008-041390 A | | 2/2008 | |
| JP | 2008-277210 | * | 11/2008 | ............. H01M 8/02 |
| JP | 2008-277210 A | | 11/2008 | |
| JP | 2008-286135 A | | 11/2008 | |
| JP | 2009-37977 A | | 2/2009 | |
| JP | 2010-540433 A | | 12/2010 | |

OTHER PUBLICATIONS

JP Partial translation review of Nakayama et al. (JP 3201124 B) updated Jan. 4, 2015.*
Extended European Search Report, Nov. 12, 2013, 9 pages.

* cited by examiner

US 9,350,027 B2

SEALING STRUCTURE AND FUEL CELL HAVING THE SEALING STRUCTURE

TECHNICAL FIELD

The present invention relates to a sealing structure and a fuel cell having the sealing structure.

BACKGROUND ART

A fuel cell is a type of device that generates electricity by electrochemically oxidizing a fuel such as hydrogen and methanol to extract electrical energy. Recently, a fuel cell has attracted attention as a clean energy supply source. Depending on the type of electrolyte used, fuel cells are classified into: phosphoric acid type, molten carbonate type, solid oxide type, polymer electrolyte type, and so forth. Among these, the polymer electrolyte fuel cell (PEFC) is a type of fuel cell including a membrane electrode assembly (MEA) in which electrodes are disposed respectively on both surfaces of an electrolyte membrane. The polymer electrolyte fuel cell (PEFC) generates electricity when hydrogen (fuel gas) is supplied to one surface of this membrane electrode assembly (MEA) and oxygen (oxidizing gas) is supplied to the other surface. Since having a power density equivalent to that of an internal combustion engine, the PEFC is now being researched extensively for its practical use as a power source of electric vehicles and the like.

Various types are proposed in a method of packaging an MEA, such as stack type, pleat type, and hollow fiber type. Among these, fuel cells of the stack type are widely used in which sheet-shaped MEAs are stacked one above the other while being isolated by sheet-shaped separators. In such a stack type fuel cell, seal members are provided between the MEA and the separator stacked on each other and between the separators to thereby hermetically seal the fuel gas and the oxidizing gas inside the fuel cell.

A stack type fuel cell described in JP-A 2006-107862 has a sealing structure in which an adhesive is used as a seal member. The adhesive has an improved adhesion as a result of direct application of the adhesive to a base member of a metal separator with no surface treatment performed on a surface of the separator where the adhesive is applied.

SUMMARY OF INVENTION

However, although the adhesion between the metal separators is improved in the above sealing structure, it is difficult to ensure a sufficient adhesion between the metal separator and another component (for example, a resin film of a MEA, or the like). For this reason, in cases where multiple components need to adhere and bond to each other, where the material of the separator is altered, or in other cases, multiple different adhesives have to be used, depending on adhesion spots. The above structure is disadvantageous in terms of facility and cost.

The present invention has been made to solve the above problems, and an object thereof is to provide: a sealing structure having improved adhesiveness without a variety of seal members and achieving cost reduction; and a fuel cell having the sealing structure.

Solution to Problem

A first aspect of the present invention is a sealing structure including: components respectively having sealing surfaces on surfaces thereof facing each other; and a seal member interposed between the sealing surfaces to make the sealing surfaces closely adhere to each other, and at least a hard carbon film is formed on one or both of the sealing surfaces.

A second aspect of the present invention is a fuel cell having the sealing structure.

DESCRIPTION OF EMBODIMENTS

Hereinafter, preferred embodiments of the present invention will be described with reference to the drawings. The technical scope of the present invention should be determined based on the description of claims, and is not limited only to the following embodiments. Note that, in the description of the drawings, identical components are denoted by identical reference symbols, and redundant description will be omitted. Moreover, the dimensional proportions of the drawings are exaggerated for convenience of the description and may be different from the actual proportions.

First Embodiment

Figure 1:
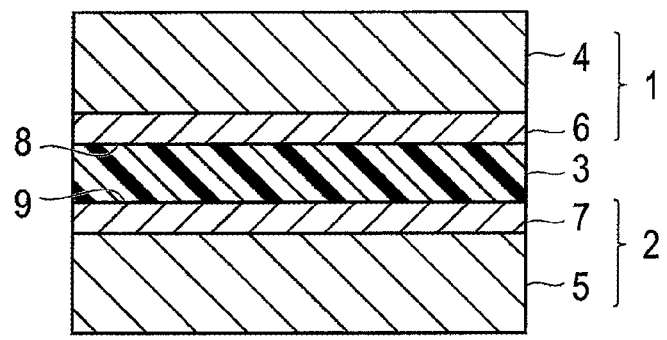
FIG. 1 is a cross-sectional view showing a sealing structure according to a first embodiment.

FIG. 1 is a cross-sectional view showing a sealing structure according to a first embodiment of the present invention.

The sealing structure according to the first embodiment hermetically seals a gap between a first component 1 and a second component 2. The first component 1 and the second component 2 respectively include: base members 4 and 5; and hard carbon films (DLC, diamond-like carbon) 6 and 7 covering surfaces of the base members 4 and 5, the surfaces facing each other. The surfaces of the hard carbon films 6 and 7 respectively serve as sealing surfaces 8 and 9 that closely adhere to a seal member 3. Between the sealing surfaces 8 and 9, the seal member 3 is interposed to make the two sealing surfaces 8 and 9 closely adhere to each other.

The material of the base members 4 and 5 of the first component 1 and the second component 2 is not limited, as long as the hard carbon films 6 and 7 can be formed thereon. The material of the first component 1 may differ from that of the second component 2. Additionally, the hard carbon films 6 and 7 do not have to cover the entire surfaces of the base members 4 and 5. It is only necessary to cover regions including portions closely adhering to the seal member 3.

As the hard carbon films 6 and 7, a nonconductive or conductive hard carbon film can be used, depending on the usage of the components. Note that a hard carbon film having a conductive property will be described later.

In the sealing structure according to the first embodiment, the hard carbon films 6 and 7 are formed on the respective sealing surfaces of the first component 1 and the second component 2. Accordingly, even if base members having different surface properties are used for the first component 1 and the second component 2, the seal member 3 can uniformly demonstrate its adhesiveness, and a stable sealing performance can be obtained.

Moreover, since the hard carbon films 6 and 7 are excellent in adhesiveness to the seal member 3 made of a resin or the like, a sealing structure excellent in adhesiveness can be provided.

Second Embodiment

Figure 2:
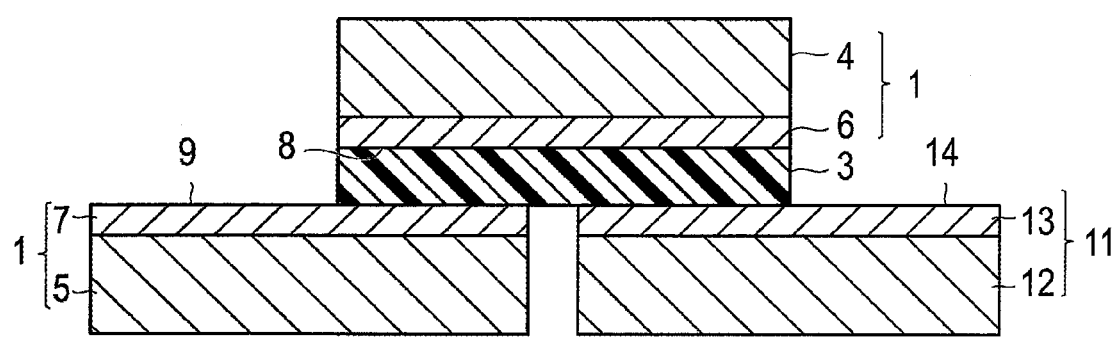
FIG. 2 is a cross-sectional view showing a sealing structure according to a second embodiment.

FIG. 2 is a cross-sectional view showing a sealing structure according to a second embodiment of the present invention.

The sealing structure according to the second embodiment is a structure in which the same first component 1 as that in the first embodiment closely adheres to two (multiple) components of the second component 2 and a third component 11 by the seal member 3. The second component 2 and the third component 11 respectively include base members 5 and 12 whose surfaces facing the first component 1 are covered with hard carbon films 7 and 13. The surfaces covered with the hard carbon films 7 and 13 respectively serve as sealing surfaces 9 and 14 that closely adhere to the seal member 3.

Even to a structure in which multiples components closely adhere to a single component as described above, the application of the sealing structure according to the present invention can improve the adhesiveness of the seal member.

Third Embodiment

Figure 3:
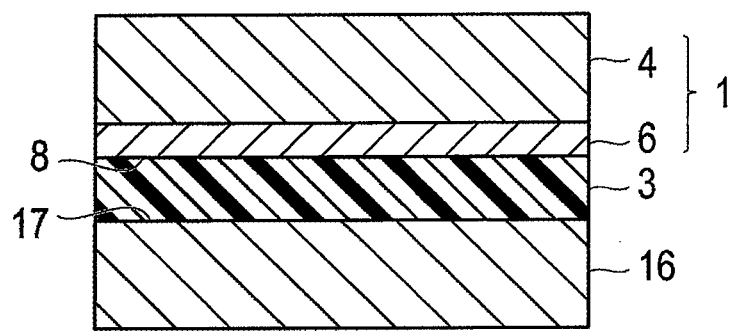
FIG. 3 is a cross-sectional view showing a sealing structure according to a third embodiment.

FIG. 3 is a cross-sectional view showing a sealing structure according to a third embodiment of the present invention.

In the sealing structure according to the third embodiment, the seal member 3 makes the first component 1 and a second component 16 closely adhere to each other as in the first embodiment. However, this embodiment is different from the first embodiment in that no hard carbon film is formed on a sealing surface 17 of the second component 16.

The material of the base member 4 of the first component 1 is not limited, as long as a hard carbon film can be formed thereon. Additionally, the material of the base member of the second component 16 may differ from that of the base member 4 of the first component 1. For the seal member 3, a material having high adhesiveness to the base member of the second component 16 is preferably selected.

In the sealing structure according to the third embodiment, the hard carbon film 6 capable of demonstrating high adhesiveness even when the seal member 3 is altered is formed on the first component 1. Accordingly, the selection of the seal member 3 in accordance with the base member of the second component having no hard carbon film formed thereon can lead to favorable adhesiveness of the seal member 3.

Fourth Embodiment

Figure 4:
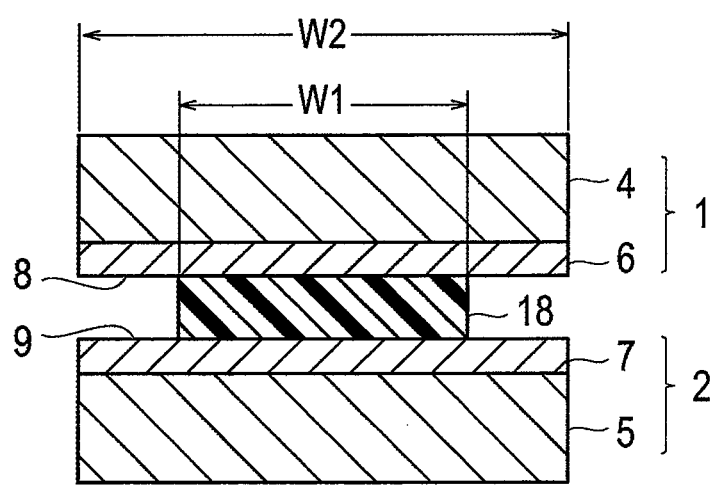
FIG. 4 is a cross-sectional view showing a sealing structure according to a fourth embodiment.

FIG. 4 is a cross-sectional view showing a sealing structure according to a fourth embodiment of the present invention.

In the sealing structure according to the fourth embodiment, a seal member 18 makes the first component 1 and the second component 2 closely adhere to each other as in the first embodiment. However, this embodiment is different from the first embodiment in that a width W1 of the seal member 18 is formed smaller than a width W2 each of the hard carbon films 6 and 7 of the first component 1 and the second component 2. The width W1 is one in a direction parallel to the sealing surfaces 8 and 9 in the cross section of the seal member 18 perpendicular to the sealing surfaces 8 and 9. The width W2 is one in a direction parallel to the sealing surfaces 8 and 9 in the cross sections of the hard carbon films 6 and 7 perpendicular to the sealing surfaces 8 and 9.

In the sealing structure according to the fourth embodiment, the seal member 18 surely closely adheres only to the hard carbon films. Accordingly, the seal member can uniformly demonstrate excellent adhesiveness, and a stable sealing performance can be obtained.

Fifth Embodiment

Figure 5:
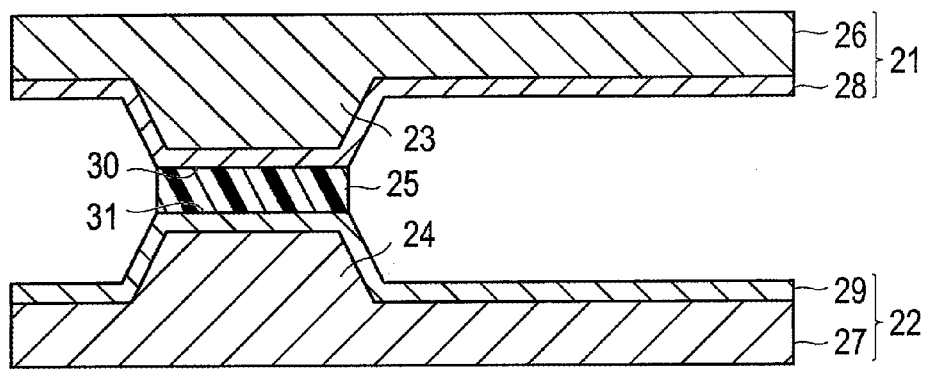
FIG. 5 is a cross-sectional view showing a sealing structure according to a fifth embodiment.
Figure 6:
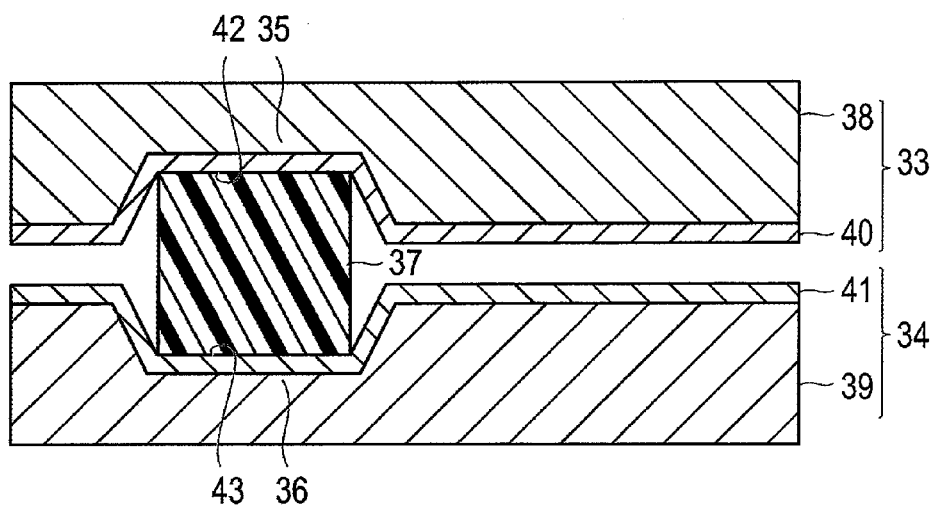
FIG. 6 is a cross-sectional view showing a modified example of the sealing structure according to the fifth embodiment.
Figure 7:
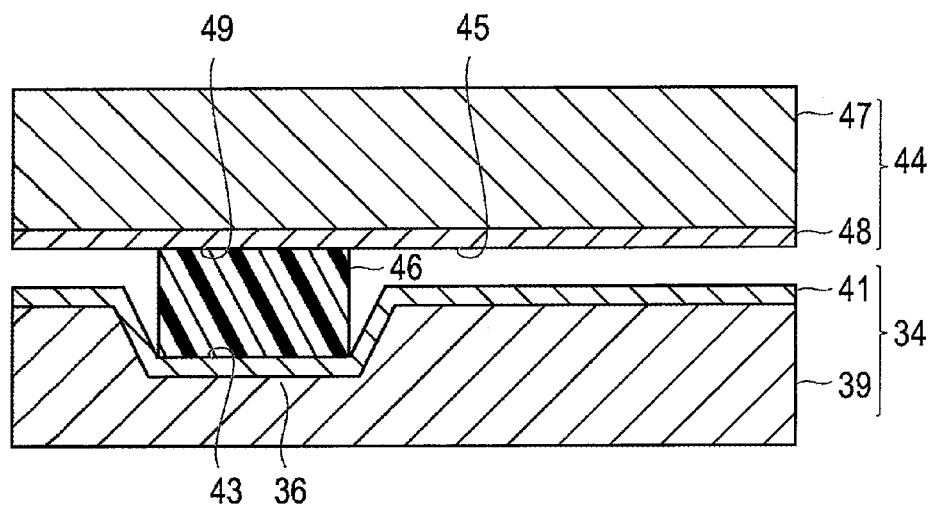
FIG. 7 is a cross-sectional view showing another modified example of the sealing structure according to the fifth embodiment.

FIG. 5 is a cross-sectional view showing a sealing structure according to a fifth embodiment of the present invention. FIG. 6 is a cross-sectional view showing a modified example of the sealing structure according to the fifth embodiment. FIG. 7 is a cross-sectional view showing another modified example of the sealing structure according to the fifth embodiment. FIG.

8 is a cross-sectional view showing still another modified example of the sealing structure according to the fifth embodiment.

The sealing structure according to the fifth embodiment is different from those of the first to the fourth embodiments in that a protruding portion or a recessed portion is formed on at least one of surfaces of components facing each other, and that a seal member closely adheres to the protruding portion or the recessed portion.

As shown in FIG. 5, in the sealing structure according to the fifth embodiment, protruding portions 23 and 24 are respectively formed on surfaces of base members 26 and 27 of a first component 21 and a second component 22, the surfaces facing each other. The protruding portions 23 and 24 protrude in a direction perpendicular to the surfaces. The surfaces of the base members 26 and 27 facing each other are respectively covered with hard carbon films 28 and 29. Top end surfaces of the protruding portions 23 and 24 covered with the hard carbon films 28 and 29 are substantially parallel to and face each other, and serve as sealing surfaces 30 and 31 that closely adhere to a seal member 25. The seal member 25 is interposed between the sealing surfaces 30 and 31 to make the two sealing surfaces 30 and 31 closely adhere to each other.

The material of the base members 26 and 27 of the first component 21 and the second component 22 is not limited, as long as the hard carbon films 28 and 29 can be formed. The material of the first component 21 may differ from that of the second component 22.

In the sealing structure according to a modified example of the fifth embodiment, as shown in FIG. 6, recessed portions 35 and 36 are respectively formed on surfaces of base members 38 and 39 of a first component 33 and a second component 34, the surfaces facing each other. The surfaces of the base members 38 and 39 facing each other are respectively covered with hard carbon films 40 and 41. Bottom surfaces of the recessed portions 35 and 36 covered with the hard carbon films 40 and 41 are substantially parallel to and face each other, and serve as sealing surfaces 42 and 43 that closely adhere to a seal member 37. The seal member 37 is interposed between the sealing surfaces 42 and 43 to make the two sealing surfaces 42 and 43 closely adhere to each other.

In the sealing structure according to another modified example of the fifth embodiment, as shown in FIG. 7, the second component 34 having the recessed portion 36 closely adheres to a first component 44 having a flat surface 45. Surfaces of base members 39 and 47 of the first component 44 and the second component 34 facing each other are respectively covered with hard carbon films 41 and 48. The bottom surface of the recessed portion 36 and the flat surface 45 which are covered with the hard carbon films 41 and 48 are substantially parallel to and face each other, and serve as sealing surfaces 43 and 49 that closely adhere to a seal member 46. The seal member 46 is interposed between the sealing surfaces 43 and 49 to make the two sealing surfaces 43 and 49 closely adhere to each other.

Figure 8:
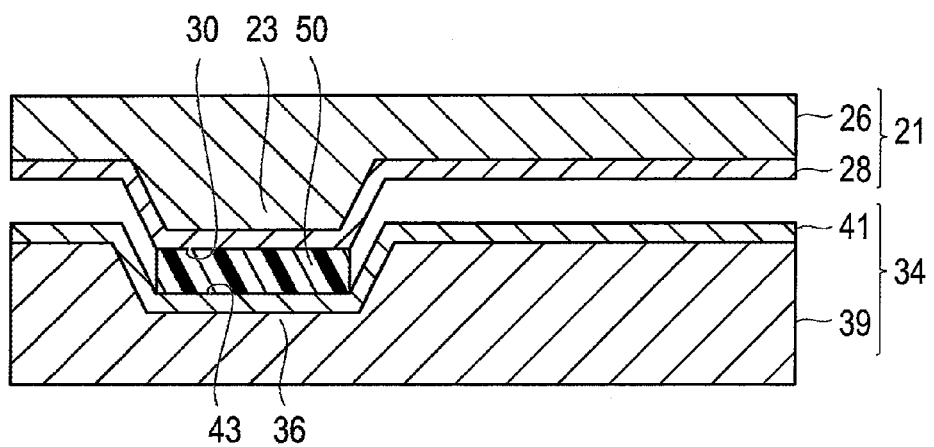
FIG. 8 is a cross-sectional view showing still another modified example of the sealing structure according to the fifth embodiment.

In the sealing structure according to still another modified example of the fifth embodiment, as shown in FIG. 8, the first component 21 having the protruding portion 23 closely adheres to the second component 34 having the recessed portion 36. The surfaces of the base members 26 and 39 of the first component 21 and the second component facing each other are respectively covered with the hard carbon films 28 and 41. The top end surface of the protruding portion 23 and the bottom surface of the recessed portion 36 which are covered with the hard carbon films 28 and 41 are substantially parallel to and face each other, and serve as the sealing surfaces 30 and 43 that closely adhere to a seal member 50. The seal member 50 is interposed between the sealing surfaces 30 and 43 to make the two sealing surfaces 30 and 43 closely adhere to each other.

In the sealing structures according to the fifth embodiment, the hard carbon film covers the surface having a recessed or protruding shape of the component. Thereby, the surface can serve as the sealing surface, and a stable sealing performance can be obtained.

Moreover, since the hard carbon films are excellent in adhesiveness to the seal members, a sealing structure excellent in adhesiveness can be provided.

Incidentally, the hard carbon films do not always have to cover the base members entirely. Accordingly, it is only necessary to cover regions including portions closely adhering to the seal members. The hard carbon film may be formed only on a portion having a recessed or protruding shape, for example.

Generally, the surface of an adherend which closely adheres to a seal member demonstrates more excellent adhesiveness as the wettability becomes higher. The critical surface tension of a metal surface having a hard carbon film formed thereon was compared with the critical surface tension of a metal surface having gold plating to evaluate the wettability of a hard carbon film. The critical surface tension refers to an extrapolated value $\gamma_C$ of a surface tension $\gamma_L$ that gives $\cos \theta = 1$ where $\cos \theta$ is plotted against $\gamma_L$ (Zisman Plot) by measuring the contact angles $\theta$ formed between droplets and a solid surface using multiple similar liquids whose surface tensions $\gamma_L$ are known. If the surface tension $\gamma_L$ of a liquid is higher than the critical surface tension $\gamma_C$ of a solid surface, the liquid keeps its drop form on the solid surface. Meanwhile, if lower, the liquid spreads over and wets the solid surface well. In other words, the higher the critical surface tension, the more likely the solid surface is to be wet. The critical surface tension of a metal surface having a hard carbon film formed thereon and the critical surface tension of a metal surface having gold plating were measured by the above approach. Then, the former was divided by the latter to obtain a ratio of the critical surface tensions of the two surfaces. Table 1 shows the obtained result.

TABLE 1

| Adherend | Critical surface tension ratio |
| --- | --- |
| Hard carbon film | 1.3 |
| Gold plating | 1.0 |

From Table 1, it can be seen that the metal surface having a hard carbon film formed thereon had a critical surface tension approximately 1.3 times higher than the metal surface having gold plating and thus a hard carbon film had a higher wettability than a seal member.

FIGS. 9 to 16 relate to sealing structures according to sixth to eighth embodiments of the present invention. These embodiments differ from the above-described embodiments in that groove portions are formed in a sealing surface where a hard carbon film is formed.

Sixth Embodiment

Figure 9:
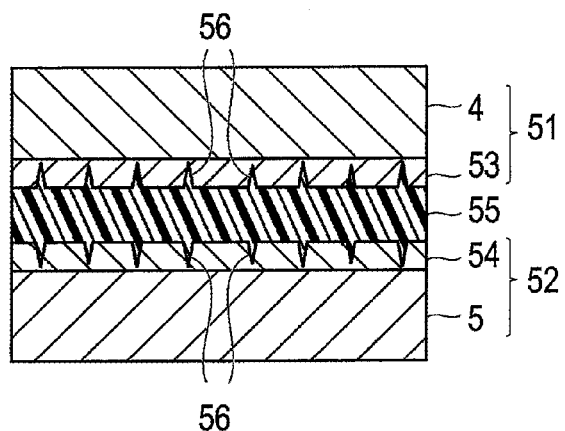
FIG. 9 is a cross-sectional view showing a sealing structure according to a sixth embodiment.

FIG. 9 is a cross-sectional view showing the sealing structure according to the sixth embodiment of the present invention.

In the sealing structure according to the fourth embodiment, a seal member 55 makes a first component 51 and a second component 52 closely adhere to each other as in the first embodiment. However, this embodiment is different from the first embodiment in that cracks 56 are formed in hard carbon films 53 and 54 respectively of the first component 51 and the second component 52.

Although the cracks 56 are formed in each of the hard carbon films 53 and 54, the cracks 56 may be formed only in one of the hard carbon films. The cracks 56 may or may not reach the base members 4 and 5 respectively of the first component 51 and the second component 52.

In the sealing structure according to the sixth embodiment, since the cracks 56 are formed in the hard carbon films 53 and 54, this increases the contact areas between the seal member 55 and the hard carbon films 53 and 54 and further improves the adhesiveness therebetween by the anchoring effect. Thus, a more stable sealing performance can be obtained.

Seventh Embodiment

Figure 10:
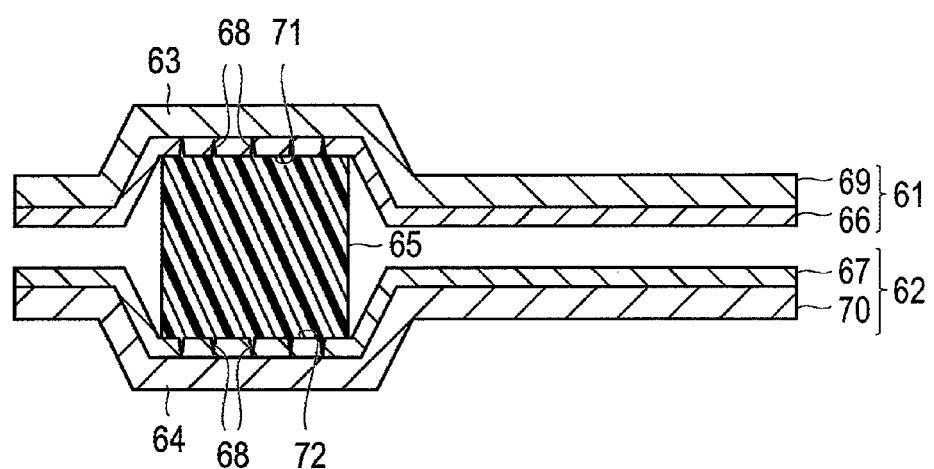
FIG. 10 is a cross-sectional view showing a sealing structure according to a seventh embodiment.
Figure 11:
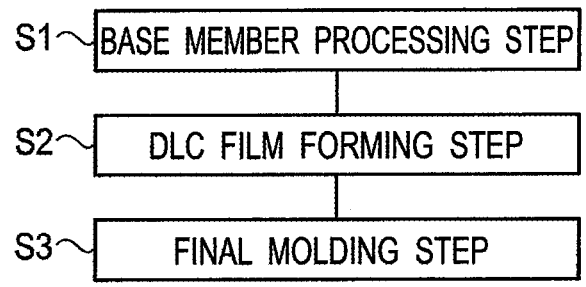
FIG. 11 is a process drawing illustrating steps of forming cracks in hard carbon films.

FIG. 10 is a cross-sectional view showing the sealing structure according to the seventh embodiment of the present invention. FIG. 11 is a process drawing illustrating steps of forming cracks in hard carbon films.

As shown in FIG. 10, in the sealing structure according to the seventh embodiment, cracks 68 are formed in hard carbon films 66 and 67 respectively of a first component 61 and a second component 62 having recessed portions 63 and 64 as in the sixth embodiment.

In the sealing structure according to the seventh embodiment, a seal member 65 is provided between the recessed portions 63 and 64 that face each other. The first component 61 and the second component 62 respectively include base members 69 and 70 whose surfaces facing each other are covered with the hard carbon films 66 and 67. Bottom surfaces of the recessed portions 63 and 64 covered with the hard carbon films 66 and 67 serve as sealing surfaces 71 and 72 that closely adhere to the seal member 65.

To mold the first component 61 and the second component 62, as shown in FIG. 11, base members each having a predetermined shape are first cut out from a plate-shaped member (base member processing step: S1). Next, hard carbon films are formed on surfaces of the base members, the surfaces serving as sealing surfaces (hard carbon film forming step: S2). Then, a final molding processing is performed so as to deform the hard carbon films at least on surfaces that serve as the sealing surfaces 71 and 72 (final molding step: S3). The final molding step S3 is performed by, for example, press working to mold the base member into the shape of a flow path or the like. If press working is adopted, a tension or compression force is exerted on a hard carbon film, and thus cracks can be formed in the hard carbon film formed on the sealing surface.

In the sealing structure according to the seventh embodiment, the hard carbon films 66 and 67 cover the components each having a recessed or protruding shape to thereby form the sealing surfaces 71 and 72, and a stable sealing performance can be obtained. Further, the cracks 68 are formed in the hard carbon films 66 and 67. This increases the contact areas between the seal member 65 and the hard carbon films 66 and 67, and an anchoring effect is also produced. Thus, the adhesiveness is improved, and a stable sealing performance can be obtained.

Incidentally, instead of providing the seal member 65 between the recessed portions 63 and 64 as described above, other configurations can be adopted, as long as sealing surfaces are formed on portions where cracks can be formed by deformation, such as pairs of a protruding portion and a recessed portion and of protruding portions.

Additionally, the above sealing-surface forming method is a sealing-surface forming method in which a sealing surface is formed to make a component closely adhere to another component. In the method, a hard carbon film is formed in advance on a surface of a base material the surface serving as the sealing surface. Then, at least a surface where the hard carbon film is formed is deformed. Thereby, cracks are formed in the hard carbon film to form the sealing surface. In this sealing-surface forming method, the surface where the hard carbon film is formed is intentionally deformed, and thereby cracks are formed in the hard carbon film to form the sealing surface. Accordingly, cracks are formed in a desired portion of the surface serving as the sealing surface, and the adhesiveness of the portion to the seal member can be improved. Hence, this eliminates the need to consider the adhesiveness between the seal member and the base member covered with the hard carbon film when the sealing surfaces closely adhere by the seal member. Consequently, the kind of seal member is reduced to achieve cost reduction.

Eighth Embodiment

Figure 12:
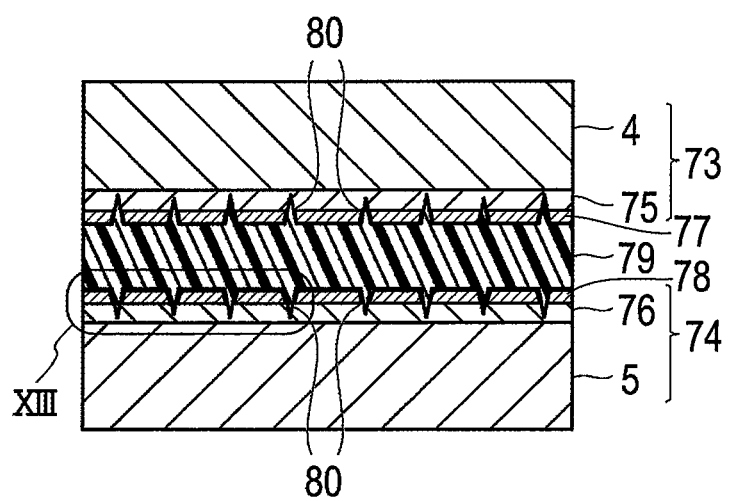
FIG. 12 is a cross-sectional view showing a sealing structure according to an eighth embodiment.

FIG. 12 is a cross-sectional view showing a sealing structure according to an eighth embodiment.

In the sealing structure according to the eighth embodiment, a seal member 79 makes a first component 73 and a second component 74 closely adhere to each other as in the first embodiment. However, this embodiment is different from the above embodiment in that the first component 73 and the second component 74 respectively include the base members 4 and 5 and hard carbon films 77 and 78 as well as intermediate layers 75 and 76 interposed therebetween. The intermediate layers 75 and 76 each have a columnar crystal structure, and gaps 80 constituting the groove portions are formed between the crystals.

Incidentally, in this embodiment, although the gaps 80 are formed in both sealing surfaces of the first component 73 and the second component 74 as shown in FIG. 12, the gaps 80 may be formed only in one of the sealing surfaces.

Hereinbelow, the configuration of the second component 74 will be described based on FIGS. 13 to 16. Note that the configuration of the first component 73 is the same as that of the second component 74, and the description thereof will be omitted herein.

Figure 13:
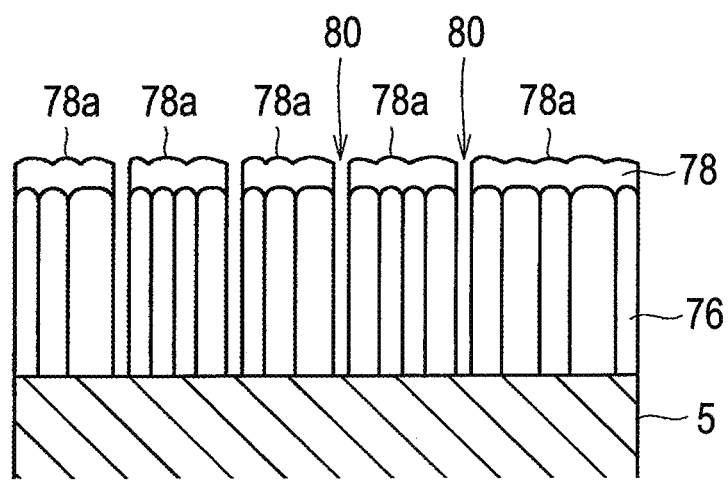
FIG. 13 is an enlarged view of an XIII portion in FIG. 12.

FIG. 13 is an enlarged view of an XIII portion in FIG. 12. As shown in FIG. 13, in the sealing structure according to the eighth embodiment, the second component 74 includes: the base member 5; the hard carbon film 78 formed on the outermost surface of the second component 74; the intermediate layer 76 interposed therebetween and having a columnar crystal structure; and the gaps 80 between the crystals.

The intermediate layer 76 has a function of improving the adhesiveness between the base member 5 and the hard carbon film 78 and a function of preventing ion elusion from the base member 5. These functions are further noticeably demonstrated when the base member 5 is made of aluminum or an alloy thereof.

The material for the intermediate layer 76 is preferably one that provides the above adhesiveness. Examples thereof include Group 4 metals (Ti, Zr, Hf), Group 5 metals (V, Nb, Ta) and Group 6 metals (Cr, Mo, W) in the periodic table, carbides, nitrides, and carbonitrides thereof, and the like. Above all, preferably used is a metal having less ion elution such as chromium (Cr), tungsten (W), titanium (Ti), molybdenum (Mo), niobium (Nb) or hafnium (Hf), or a nitride, carbide, or carbonitride thereof. More preferably used is Cr, Ti, or a carbide or nitride thereof. Particularly, when Cr, Ti, or a carbide or nitride thereof is used, the roles of the intermediate layer 76 are to ensure the adhesiveness to the hard carbon film 78 on the upper side and the anticorrosive effect on the underlying base member 5. Particularly, when the base member 5 is formed of aluminum or an alloy thereof, the water content having reached near the interface causes corrosion to proceed, and an aluminum oxide film is formed. Chromium and titanium (or carbides or nitrides thereof) are particularly useful in that elution of such metals themselves is hardly observed even if a portion thereof is exposed due to formation of a passivation film. Above all, when the aforementioned metal having less ion elution (particularly Cr or Ti) or a carbide or nitride thereof is used, the corrosion resistance of the base member 5 can be significantly improved.

The thickness of the intermediate layer 76 is not particularly limited. However, from the viewpoint of making the size of the final product as small as possible by forming the second component 74 more thinly, the thickness of the intermediate layer 76 is preferably 0.01 µm to 10 µm, more preferably 0.02 µm to 5 µm, further preferably 0.05 µm to 5 µm, and particularly preferably 0.1 µm to 1 µm. If the thickness of the intermediate layer 76 is 0.01 µm or larger, a uniform layer is formed. This makes it possible to effectively improve the corrosion resistance of the base member 5. Meanwhile, if the thickness of the intermediate layer 76 is 10 µm or smaller, an increase in the film stress on the film intermediate layer 76 is suppressed, and a decrease in the film followability to the base member 5 and the generation of peeling and cracks associated with the decrease are prevented.

The columnar crystal structure of the intermediate layer 76 refers to a structure in which crystals of the metal for forming the intermediate layer 76 grow columnarly in a film thickness direction. The average thickness of columnar crystals in the cross section of the intermediate layer 76 (i.e., an average value of the column thicknesses of the columnar crystals in the cross section of the intermediate layer 76) is preferably 35 nm (upper limit: 80 nm, lower limit: 20 nm).

The gaps 80 are gaps formed between the columnar crystals of the intermediate layer 76. The width of each gap is not particularly limited, but preferably 0.1 nm to 20 nm in a plan view, and the length is preferably in a range of 0.01 µm to 10 µm. Moreover, it is preferable that a large number of the gaps 80 be uniformly distributed in the surface of the intermediate layer 76. The depth of the gap 80 is not particularly limited, but from the viewpoint of enhancing the anchoring effect, the gap 80 is preferably formed as deep as possible within the thickness range of the intermediate layer 76.

Note that the gap 80 is illustrated in FIG. 13 as if the width thereof is uniform in the film thickness direction from an end portion on the outermost surface side to an end portion on the base member side. However, FIG. 13 is a view schematically representing the shape of the columnar crystals. The gap 80 includes a gap having a width widened from the base member side toward the outermost surface side, a gap having a width widened from the outermost surface side toward the base member side, and further a gap having a width irregularly changing from the end portion on the outermost surface side to the end portion on the base member side. Moreover, in FIG. 13, the adjacent columnar crystals sandwiching the gap 80 therebetween are illustrated as if the columnar crystals are not in contact with each other. However, the adjacent columnar crystals sandwiching the gap 80 therebetween include those that are in contact with each other in an integrated manner at one spot or multiple spots on their side surfaces from the end portion on the outermost surface side to the end portion on the base member side. Locally, the gaps 80 are distributed as if a three-dimensional gap network is formed within the intermediate layer 76.

Note that the hard carbon film 78 formed on the outermost surface of the second component 74 is formed of particles 78a each having a diameter of 50 nm to 100 nm. Meanwhile, the hard carbon film 78 is not formed on the gaps 80 having sufficiently large widths in the outermost surface of the intermediate layer 76. The portion where the hard carbon film 78 is not formed and the gap 80 constitute the groove portion.

A film forming method for the intermediate layer 76 having the columnar crystal structures and the hard carbon film 78 will be described below.

First, as the constituent material of the base member 5, an aluminum plate, its alloy plate, a titanium plate, a stainless steel plate, or the like having a desired thickness is prepared. Then, using an appropriate solvent, degreasing and cleaning processes are performed on the surface of the prepared constituent material of the base member 5. As the solvent, it is possible to use ethanol, ethers, acetone, isopropyl alcohol, trichloroethylene, caustic alkali agent, and the like. Examples of the degreasing and cleaning processes include ultrasonic cleaning and the like. As the conditions for the ultrasonic cleaning, the processing time is approximately 1 to 10 minutes, the frequency is approximately 30 to 50 kHz, and the power is approximately 30 to 50 W.

Subsequently, an oxide film formed on the surface of the constituent material of the base member 5 is removed. Examples of the approach to remove the oxide film include a cleaning process with acid, a dissolution process by electric potential application, an ion bombardment process, and the like. Besides, the following method is preferably used in which: alkaline immersion cleaning, oxide film removal with alkali (alkali etching), and surface activation with a mixed acid solution containing hydrofluoric acid are performed; then, zincate treatment is performed in a zinc displacement bath. The conditions for the zincate treatment are not particularly limited. For example, the bath temperature is 10 to 40° C., and the immersion time is 20 to 90 seconds. Incidentally, the above oxide film removal step may be omitted.

Next, on the surface of the constituent material of the base member 5 having subjected to the above processes, the intermediate layer 76 and the hard carbon film 78 are sequentially formed. For example, first, using the above-described constituent material (for example, chromium) of the intermediate layer 76 as a target, the chromium intermediate layer 76 is stacked on the surface of the base member 5 (for example, aluminum or an alloy thereof) with a bias voltage to be described later. Next, using the constituent material (for example, graphite) of the hard carbon film 78 as the subsequent target, a layer containing carbon is stacked at an atomic level on the surface of the intermediate layer 76. Thereby, the intermediate layer 76 and the hard carbon film 78 can be sequentially formed. Furthermore, the adhesiveness of the interfaces between the hard carbon film 78, the intermediate layer 76 and the base member 5, which directly adhere to each other, and the adhesiveness therearound are retained over a long period of time by the intermolecular force and intrusion of a slight amount of carbon atoms.

Examples of the approach suitably adopted in stacking the intermediate layer 76 and the hard carbon film 78 include physical vapor deposition (PVD) processes such as a sputtering process and an ion plating process; ion beam deposition processes such as a filtered cathodic vacuum arc (FCVA) process; and the like. Examples of the sputtering process include a magnetron sputtering process, an unbalanced magnetron sputtering (UBMS) process, a dual magnetron sputtering process, an ECR sputtering process, and the like. Moreover, examples of the ion plating process include an arc ion plating process, and the like. Above all, the sputtering process and the ion plating process are preferably used, and the sputtering process is particularly preferably used. According to such an approach, a carbon layer with less hydrogen content can be formed. As a result, the proportion of bonds between carbon atoms ($sp^2$ hybridized carbons) can be increased. When the hard carbon film is requested to have a conductive property, an excellent conductive property can be achieved, and thus such a process is useful. In addition to this, there are advantages that the film formation is possible at relatively low temperature, and that the damage to the base member 5 can be suppressed to a minimum. Furthermore, in the sputtering process, the intermediate layer 76 having the above columnar crystal structure can be obtained by controlling the bias voltage or the like.

When the intermediate layer 76 and the hard carbon film 78 are formed by the sputtering process, a negative bias voltage should be applied to the base member 5 during the sputtering. In such a mode, the intermediate layer 76 having the columnar crystal structure and the hard carbon film 78 formed of densely assembled graphite clusters are formed by an ion irradiation effect. Such an intermediate layer 76 can enhance the anticorrosive effect on the base member 5, and enables even a corrosion susceptible metal such as aluminum to be employed as the base member 5. Moreover, when the component 74 is employed as a conductive member, there is an advantage that the contact resistance to another conductive member is made lower because the hard carbon film 78 demonstrates an excellent conductive property.

In this mode, the absolute value of the negative bias voltage to be applied is not particularly limited, and a voltage that enables the formation of the hard carbon film 78 is chosen. The magnitude of the voltage to be applied is preferably 50 to 500 V, more preferably 100 to 300 V. In this embodiment, the intermediate layer 76 is formed with such a low bias voltage (should be over 0 V, or over 0 V to 50 V) as not to deteriorate the coarseness of the interface with the base member 5. The optimum columnar crystal structure can be controlled through a preparatory experiment or the like.

Incidentally, the other conditions during the film formation are not particularly limited, and conventionally known findings can be referred as appropriate. Meanwhile, when the hard carbon film 78 is formed by the UBMS process, the hard carbon film 78 is preferably formed on the intermediate layer 76 formed in advance using the same apparatus and formation method. Thereby, the intermediate layer 76 and the hard carbon film 78 excellent in adhesiveness to the base member 5 are formed. Nonetheless, the hard carbon film 78 may be formed using another apparatus and formation method on the intermediate layer 76 formed using different approach and apparatus. Even in this case, the intermediate layer 76 and the hard carbon film 78 excellent in adhesiveness to the base member 5 are formed.

By the above-described approach, the intermediate layer 76 and the hard carbon film 78 are formed on one surface of the base member 5. To form the intermediate layers 76 and the hard carbon films 78 on both surfaces of the base member 5, the intermediate layer 76 and the hard carbon film 78 may be formed on the other surface of the base member 5 by the same approach. In addition, by a similar approach to ones described above, it is possible to produce the component 74 having the intermediate layers 76 and the hard carbon films 78 formed at once on both surfaces of the base member 5. To form the intermediate layers 76 and the hard carbon films 78 on both surfaces of the base member 5, commercially available film forming apparatuses (film forming apparatuses sputtering both surfaces simultaneously) may be used. Meanwhile, although not advantageous in cost, it is possible to form the intermediate layer 76 and the hard carbon film 78 on one surface of the base member 5 followed by sequential formation of the intermediate layer 76 and the hard carbon film 78 on the other surface of the base member 5. Alternatively, first, in an apparatus in which chromium is used a target, the intermediate layer 76 is formed on one surface of the base member 5; subsequently, the intermediate layer 76 is formed on the other surface; the target is thereafter switched to carbon, and the hard carbon film 78 is formed on the intermediate layer 76 having been formed on the one surface; subsequently, the hard carbon film 78 is formed on the other surface. In this way, even when the intermediate layers 76 and the hard carbon films 78 are formed on both surfaces of the base member 5, the same approach as those for the film formation on one surface can be adopted.

Figure 14:
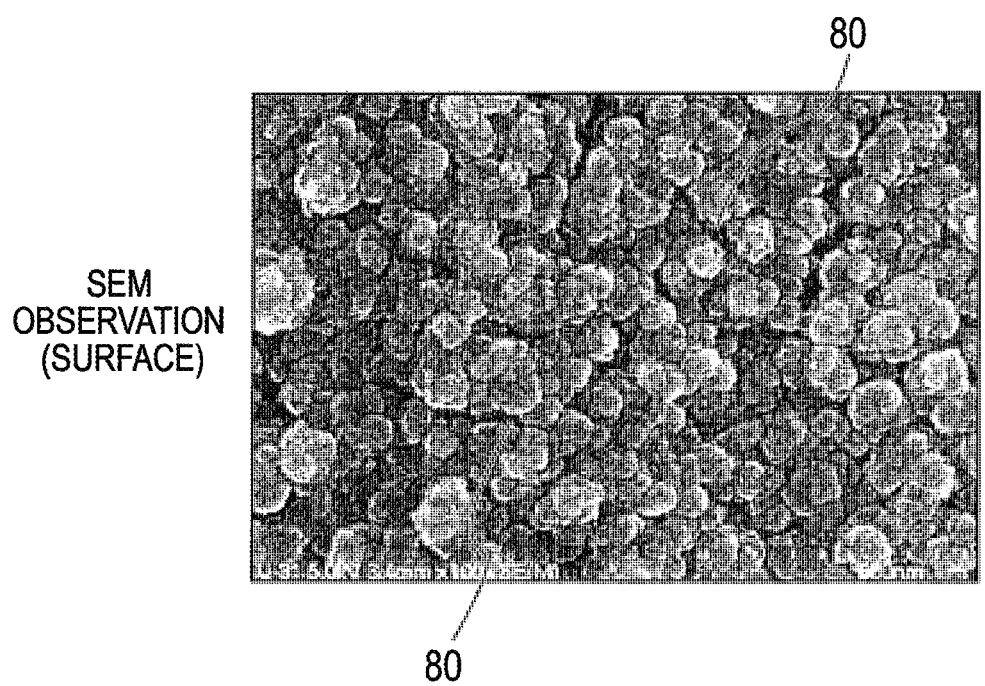
FIG. 14 is an SEM photograph for observing the surface of a component in FIG. 13.
Figure 15:
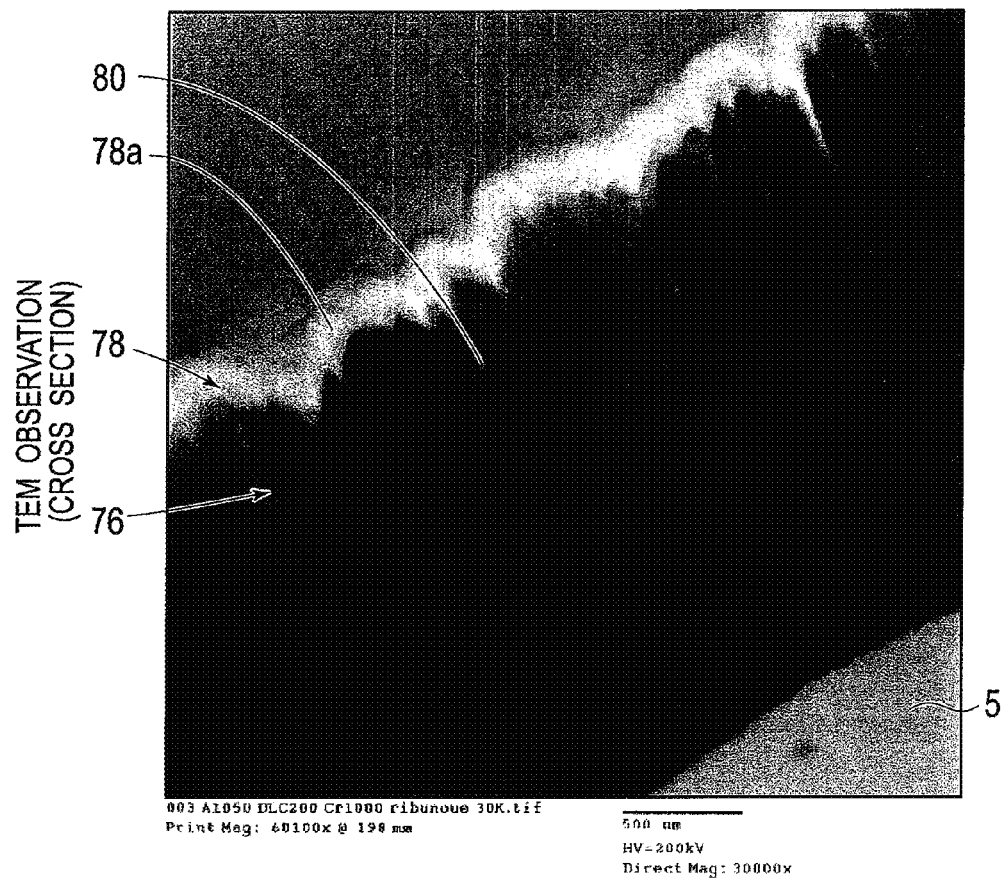
FIG. 15 is a TEM photograph for observing a cross section of the component in FIG. 13.
Figure 16:
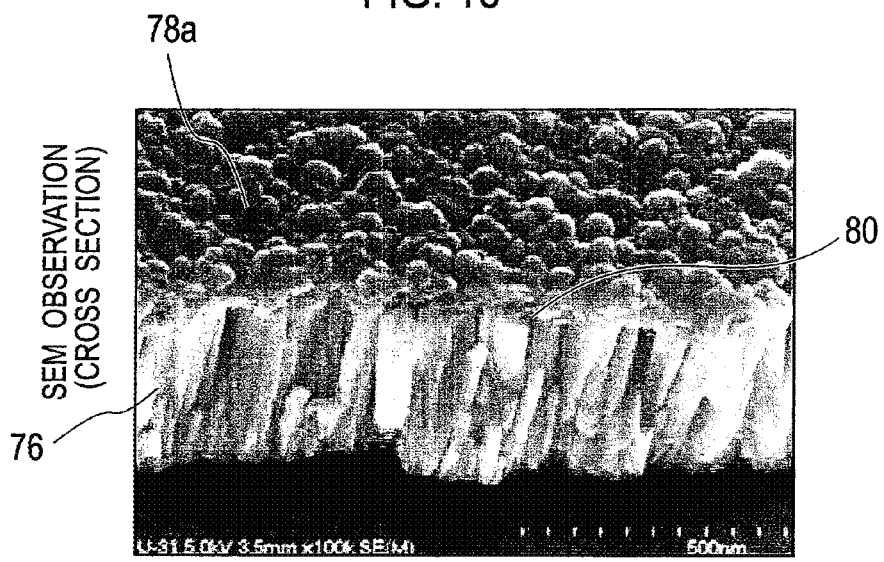
FIG. 16 is an SEM photograph for observing a cross section of the component in FIG. 13.

By the above-described method, the intermediate layer 76 and the hard carbon film 78 are formed on the surface of the base member 5. FIGS. 14 to 16 are a TEM photograph and SEM photographs for observing the surface of the base member 5 after the film formation.

Here, as the material of the base member 5, an aluminum plate (aluminum A1050) was prepared. The thickness of the aluminum plate was 200 μm. This aluminum plate was used and subjected to ultrasonic cleaning in an ethanol solution for 3 minutes as a pretreatment. Then, the base member 5 was further placed in a vacuum chamber and subjected to an ion bombardment process with Ar gas to remove an oxide film on the surface.

Next, by the unbalanced magnetron sputtering process using Cr as a target, Cr layers having a thickness of 1 μm were formed on both surfaces of the base member 5, while a negative bias voltage at 50 V was being applied. Note that the Cr layers alone serve as the intermediate layers 76.

Furthermore, by the UBMS process using a solid graphite as a target on the intermediate layers 76, the hard carbon films 78 each having a thickness of 0.2 μm were formed on the Cr layers (the intermediate layers 76) on the respective surfaces of the aluminum plate, while a negative bias voltage with the magnitude of 140 V is being applied to the aluminum plate.

From FIG. 14, the following state can be observed that the micro-particles 78a each having a diameter of 50 to 100 nm are present on the outermost surface, and the gaps 80 each having a width of approximately 20 nm and a length of approximately 1 μm are formed therebetween.

Additionally, from FIGS. 15 and 16, it can be observed that the average thickness of the columnar crystals in the cross section of the intermediate layer 76 (i.e., the average value of the columnar thicknesses of the columnar crystals in the cross section of the intermediate layer 76) is 35 nm (upper limit: 80 nm, lower limit: 20 nm), and that the width of the gap formed therebetween is 50 nm. Furthermore, it can also be observed that the thickness of the Cr intermediate layer 76 is in a range of 0.02 μm to 5 μm.

In the sealing structure according to the eighth embodiment, as in the first to the sixth embodiments, the hard carbon films 77 and 78 are formed on the outermost surfaces of the components 73 and 74. This improves the wettability of the seal member on the sealing surface. Further, in the sealing structure according to the eighth embodiment, the gaps 80 are formed between the columnar crystals in the intermediate layers 75 and 76. This increases the contact areas between the seal member 79 and the components 73 and 74 (specifically, the hard carbon film 77, 78 and the intermediate layer 75, 76), and an anchoring effect is also produced. Since the width of the gap 80 irregularly changes in the film thickness direction as described above, the anchoring effect is further enhanced. Thus, the adhesiveness of the seal member on the sealing surface is further improved, and a more stable sealing performance can be obtained.

To evaluate the adhesiveness of the seal member in this embodiment, a bonding strength test was conducted on the sealing structure according to this embodiment in accordance with the method specified in Japanese Industrial Standards (JIS-K-6850). In the test, the adherends used were: ones each obtained by forming the Cr intermediate layer and the hard carbon film according to this embodiment on the surface of a plate made of a stainless steel (Examples 1, 2); and one obtained by performing gold plating on the surface of the same plate made of a stainless steel directly, that is, with no intermediate layer provided thereon (Comparative Example). In addition, as the adhesive used were an olefin-based adhesive and a silicone-based adhesive. The maximum load at the time when each test piece is ruptured is proportional to the bonding strength of each test piece. The maximum load at the time of rupturing in each Example was divided by the maximum load at the time of rupturing in Comparative Example to obtain a ratio of the bonding strength in each Example to the bonding strength in Comparative Example. Table 2 shows the obtained result.

TABLE 2

| | Columnar crystal thickness in intermediate layer | Adhesive | |
|---|---|---|---|
| | nm | Olefin-base | Silicone-base |
| Example 1 | 80 | 1.3 | — |
| Example 2 | 20 | 1.4 | 1.5 |
| Comparative Example | — | 1.0 | 1.0 |

In Table 2, the "columnar crystal thickness" refers to an average value of the thicknesses of columns of columnar crystals in the cross section of the intermediate layer. From Table 2, it can be seen that the bonding strengths in Examples 1 and 2 were 1.3 to 1.5 times higher than that in Comparative Example, and that the sealing structure according to this embodiment demonstrates more excellent adhesiveness.

Ninth Embodiment

Figure 17:
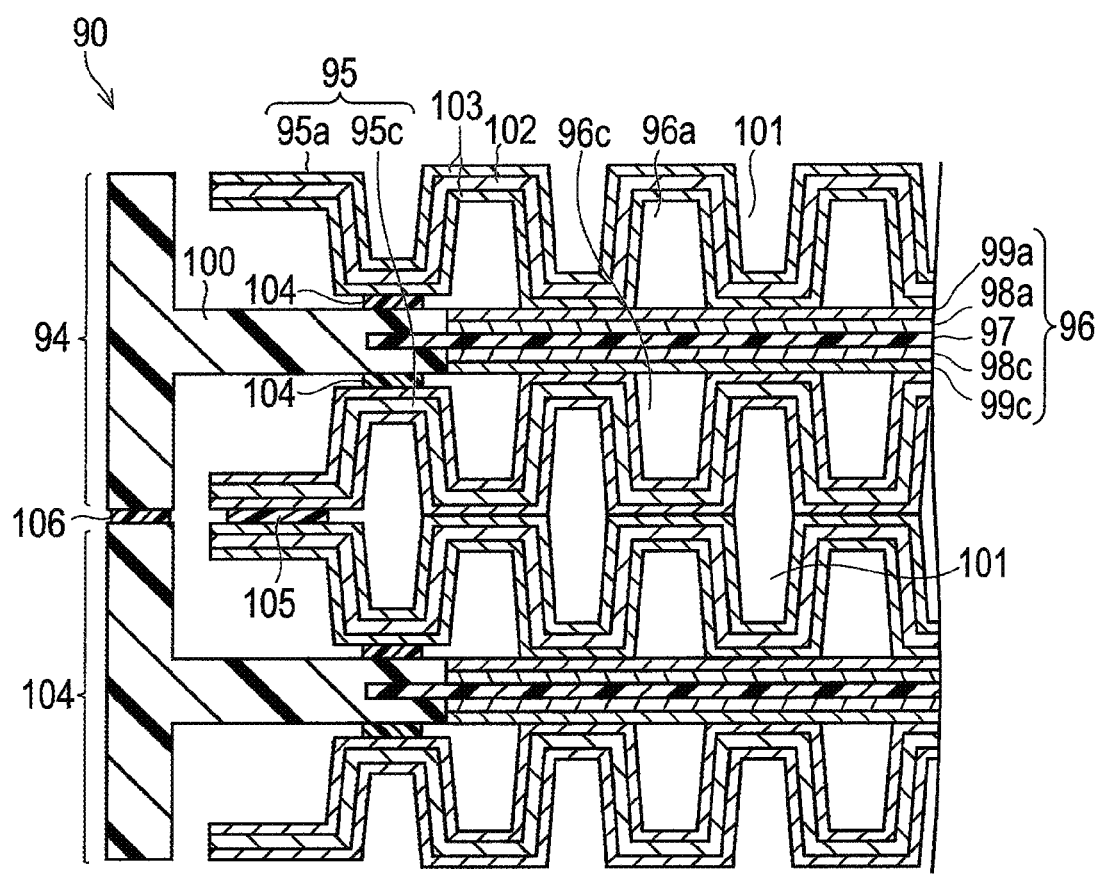
FIG. 17 is a cross-sectional view showing a sealing structure of a fuel cell according to a ninth embodiment.

FIG. 17 is a cross-sectional view showing a sealing structure of a fuel cell according to a ninth embodiment of the present invention.

The sealing structure according to the ninth embodiment is employed for a polymer electrolyte fuel cell (PEFC).

As shown in FIG. 17, a fuel cell 90 is a stack type fuel cell that is a stack formed by stacking multiple single cells 94 one above the other. The single cell 94 is a single unit of the fuel cell in which a pair of sheet-shaped separators 95 (reference numeral 95 is not described in the drawing) and a sheet-shaped membrane electrode assembly 96 are stacked. Incidentally, the number of the cells in the stack is not particularly limited, and the fuel cell stack may be formed of only a single unit of the single cell 94, or multiples of the single cells 94 stacked.

Separators 95a and 95c are each obtained by, for example, molding by pressing a thin plate having a thickness of 0.5 mm or smaller into a recessed and protruding shape as shown in FIG. 17. The protruding portions, seen from the MEA side, of the separators 95a and 95c are in contact with the membrane electrode assembly 96. This ensures electrical connection to the membrane electrode assembly 96. Meanwhile, the recessed portions, seen from the MEA side, of the separators 95a and 95c (i.e., spaces which are formed between the MEA and the separators in accordance with the recessed and protruding shape of the separators) function as gas flow paths for allowing a gas to flow during the operation of the fuel cell 90. Specifically, fuel gas (for example, hydrogen or the like) is allowed to flow in gas flow paths 96a of the anode separator 95a, while oxidant gas (for example, air or the like) is allowed to flow in gas flow paths 96c of the cathode separator 95c.

The fuel cell 90 first has a polymer electrolyte membrane 97, and a pair of catalytic layers (an anode catalytic layer 98a and a cathode catalytic layer 98c) sandwiching the polymer electrolyte membrane 97. Moreover, the stack of the polymer electrolyte membrane 97 and the catalytic layers 98a and 98c is further sandwiched by a pair of gas diffusion layers (GDLs) (an anode gas diffusion layer 99a and a cathode gas diffusion layer 99c). An electrolyte membrane supporter 100 is bonded to an edge portion of the stack of the polymer electrolyte membrane 97, the pair of catalytic layers 98a and 98c and the pair of gas diffusion layers 99a and 99c in the above state. Thus, the membrane electrode assembly (MEA) 96 is formed. The electrolyte membrane supporter 100 is formed of, for example, a thermosetting resin.

Further, in the fuel cell 90, the membrane electrode assembly 96 is sandwiched by the pair of separators (the anode separator 95a and the cathode separator 95c). In the fuel cell stack, the membrane electrode assembly 96 is sequentially stacked on another membrane electrode assembly 96 with the separator 95 interposed therebetween, and thus the stack is formed.

Meanwhile, the recessed portions, seen from a side opposite to the MEA side, of the separators 95a and 95c are formed to serve as coolant flow paths 101 for allowing a coolant (for example, water) to flow for cooling the fuel cell 90 during the operation of the fuel cell. Moreover, a manifold (unillustrated) is generally provided in the separator 95. The manifold functions as connection means for connecting each cell to the other when the stack is formed. Such a configuration can ensure the mechanical strength of the fuel cell stack.

The conductive member constituting the separators 95a and 95c has a metal base member layer 102 (base member) and conductive carbon layers 103 (hard carbon films) formed on both surfaces of the metal base member layer 102. Incidentally, an intermediate layer made of another material may be interposed between the metal base member layer 102 and the conductive carbon layer 103, as described above.

A first seal member 104 makes the separator 95 and the electrolyte membrane supporter 100 (part of the membrane electrode assembly 96) closely adhere to each other. Edge portions of the separators 95a and 95c lying on each other are made to closely adhere to each other by a second seal member 105. Further, edge portions of the electrolyte membrane supporters 100 lying on each other are made to closely adhere to each other by a third seal member 106.

Hereinafter, the constituents of the polymer electrolyte fuel cell will be described.

[Metal Base Member Layer]

The metal base member layer 102 is a main layer of the conductive member constituting the separator 95, and contributes to ensuring the conductive property and the mechanical strength.

The metal for forming the metal base member layer 102 is not particularly limited, and those conventionally used as the constituent material of a metal separator can be used as appropriate. Examples of the constituent material of the metal base member layer include iron, titanium, aluminum, and alloys thereof. These materials can be preferably used from the viewpoints of mechanical strength, versatility, cost performance, processing easiness, or the like. Here, the iron alloys include stainless steels. Above all, the metal base member layer is preferably formed of a stainless steel, aluminum or an aluminum alloy. Furthermore, particularly when a stainless steel is used for the metal base member layer, the conductive property of the contact surface with a gas diffusion base member that is the constituent material of the gas diffusion layer can be sufficiently ensured. As a result, even if water content intrudes into a film gap at a shoulder rib portion or the like, the durability can be retained by the corrosion resistance of the oxide film formed on the metal base member layer itself that is formed of the stainless steel.

The thickness of the metal base member layer 102 is not particularly limited. From the viewpoints of processing easiness, mechanical strength, improvement in energy density of the cell attributed to thinly formed separator itself, and the like, the thickness is preferably 50 to 500 μm, more preferably 80 to 300 μm, and further preferably 80 to 200 μm. Particularly, when a stainless steel is used for the constituent material, the thickness of the metal base member layer 102 is preferably 80 to 150 μm. Meanwhile, when aluminum is used for the constituent material, the thickness of the metal base member layer 102 is preferably 100 to 300 μm. When the thickness is within the above-described range, the metal base member layer 102 is excellent in processing easiness and can have a favorable thickness, while having a sufficient strength as the separator.

[Conductive Carbon Layer]

The conductive carbon layer 103 is a layer containing conductive carbon. The presence of this layer ensures the conductive property of the conductive member constituting the separator 95. Moreover, the corrosion resistance is improved and the adhesiveness to the seal member can be improved in comparison with a case of the metal base member layer 102 alone. Note that, in this embodiment, the conductive carbon layer is employed as the hard carbon film that closely adheres to the seal member; however, if the hard carbon film is provided only at a portion contacting the seal member, the hard carbon film does not need to have a conductive property. Thus, the conductive property does not always have to be provided thereto.

The conductive carbon layer 103 is preferably specified by a strength ratio R ($I_D/I_G$) of a D-band peak strength ($I_D$) to a G-band peak strength ($I_G$) measured by Raman scattering spectroscopic analysis. Specifically, the strength ratio R ($I_D/I_G$) is preferably 1.3 or higher. Hereinafter, this constituent will be described in more details.

When a carbon material is analyzed by Raman spectroscopy, peaks generally appear around 1350 $cm^{-1}$ and around 1584 $cm^{-1}$. A graphite having a high crystallinity has a single peak around 1584 $cm^{-1}$. This peak is generally referred to as a "G band." Meanwhile, as the crystallinity is lowered, that is, as defects are increased in the crystal structure and the graphite structure is disturbed, a peak around 1350 $cm^{-1}$ appears. This peak is generally referred to as a "D band" (note that the peak of a diamond is strictly at 1333 $cm^{-1}$, and distinguished from the D band). The strength ratio R ($I_D/I_G$) of the D-band peak strength ($I_D$) to the G-band peak strength ($I_G$) is used as an index for the size of graphite cluster of a carbon material, how much the graphite structure is disturbed (defects in the crystal structure), the proportion of $sp^2$ bonds, or the like. In other words, in the present invention, the strength ratio R ($I_D/I_G$) can serve as the index for the contact resistance of the conductive carbon layer 103, and can be used as a film parameter for controlling the conductive property of the conductive carbon layer 103.

The R ($I_D/I_G$) value is calculated by measuring the Raman spectrum of the carbon material using a Raman microspectroscope. Specifically, the R ($I_D/I_G$) value is obtained by calculating the relative strength ratio (peak area ratio ($I_D/I_G$)) of the peak strength ($I_D$) of 1300 to 1400 $cm^{-1}$ called the D band to the peak strength ($I_G$) of 1500 to 1600 $cm^{-1}$ called the G band.

As described above, the R value is preferably 1.3 or higher. Moreover, the R value is more preferably 1.4 to 2.0, further preferably 1.4 to 1.9, and further still preferably 1.5 to 1.8. When the R value is 1.3 or higher, the conductive carbon layer having a conductive property in the stacking direction sufficiently ensure is obtained. In addition, when the R value is 2.0 or lower, a decrease in the graphite component can be suppressed. Further, an increase in the internal stress of the conductive carbon layer itself can also be suppressed, and the adhesiveness to the underlying metal base member layer (or an intermediate layer if the intermediate layer is present) can be further improved.

Incidentally, in this embodiment, the conductive carbon layer 103 may be formed substantially only of a polycrystalline graphite or only of a polycrystalline graphite. The conductive carbon layer 103 may also contain a material other than the polycrystalline graphite. Examples of the carbon material other than the polycrystalline graphite, which may be contained in the conductive carbon layer 103, include graphite blocks (high crystallinity graphite), carbon blacks, fullerenes, carbon nanotubes, carbon nanofibers, carbon nanohorns, carbon fibrils, and the like. Moreover, specific examples of the carbon black include, but are not limited to, the followings: ketjen black, acetylene black, channel black, lamp black, oil furnace black, thermal black, and the like. Incidentally, the carbon black may be subjected to graphitization. Moreover, these carbon materials may be used in the form of complex with a resin such as a polyester based resin, an aramid based resin, and a polypropylene based resin. Other examples of the material other than the carbon material, which may be contained in the conductive carbon layer 103, include noble metals such as gold (Au), silver (Ag), platinum (Pt), ruthenium (Ru), palladium (Pd), rhodium (Rh), and indium (In); water repellent substances such as polytetrafluoroethylene (PTFE); conductive oxides; and the like. The material other than the polycrystalline graphite may be used alone or in combination of two or more kinds.

The thickness of the conductive carbon layer 103 is not particularly limited. However, the thickness is preferably 1 to 1000 nm, more preferably 2 to 500 nm, and further preferably 5 to 200 nm. When the value of the thickness of the conductive carbon layer is within such a range, a sufficient conductive property can be ensured between the gas diffusion base member and the separator. Additionally, it is possible to achieve such an advantageous effect of a high anticorrosive function provided to the metal base member layer.

Note that, in this embodiment, the Vickers hardness of the conductive carbon layer 103 is specified. The "Vickers hardness (Hv)" is a value for specifying the hardness of a substance, and a unique value to a substance. Herein, the Vickers hardness means a value measured by a nanoindentation method. The nanoindentation method is an approach in which a diamond indenter with an extremely small load is continuously loaded or unloaded on a sample surface, and the hardness is measured from a load-displacement curve thus obtained. The higher Hv means that the substance is harder. In this embodiment, the Vickers hardness of the conductive carbon layer 103 is preferably 1500 Hv or lower, more preferably 1200 Hv or lower, further preferably 1000 Hv or lower, and particularly preferably 800 Hv or lower. When the value of the Vickers hardness is within such a range, excessive intrusion of $sp^3$ carbon not having a conductive property is suppressed, and a decrease in the conductive property of the conductive carbon layer 103 can be prevented. Meanwhile, the lower limit value of the Vickers hardness is not particularly limited. However, if the Vickers hardness is 50 Hv or higher, the hardness of the conductive carbon layer 103 is sufficiently ensured. As a result, it is possible to provide a conductive member (separator 95) which can withstand an impact such as contact, friction, or the like from the outside, and which is also excellent in adhesiveness to the underlying metal base member 102. Furthermore, in a mode with an intermediate layer provided as in the eighth embodiment, the conductive carbon layer 103 can more firmly closely adhere to the intermediate layer, and an excellent conductive member can be provided. From such viewpoints, the Vickers hardness of the conductive carbon layer 103 is more preferably 80 Hv or higher, further preferably 100 Hv or higher, and particularly preferably 200 Hv or higher. Note that, herein, the Vickers hardness of the hard carbon film preferably falls within the above range.

(Method for Producing Conductive Member)

A method for producing the above-described conductive member is not particularly limited, and the production is possible by referring to conventionally known approaches as appropriate. Hereinafter, an example of producing the conductive member will be illustrated. Meanwhile, conditions such as the material of each constituent of the conductive member constituting the separator 95 are as described above, and the description thereof will be omitted here.

First, a stainless steel plate or the like having a desired thickness is prepared as the constituent material of the metal base member layer. Then, using an appropriate solvent, degreasing and cleaning processes are performed on the surface of the prepared constituent material of the metal base member layer. Subsequently, an oxide film formed on a surface (or both surfaces) of the constituent material of the metal base member layer is removed. Thereafter, a conductive carbon layer is formed on the surface of the constituent material of the metal base member layer having being subjected to the above-described processes. The details of these steps and the approach suitably used for stacking the conductive carbon (film formation) have been described in detail in the eighth embodiment, and the descriptions thereof will be omitted here.

When the conductive carbon layer is formed by a sputtering process, a negative bias voltage should be applied to the metal base member layer during the sputtering. In such a mode, a conductive carbon layer having a structure in which graphite clusters are densely assembled can be formed by an ion irradiation effect. Such a conductive carbon layer can demonstrate an excellent conductive property. This makes it possible to provide a conductive member (separator) having a low contact resistance to another member (for example, MEA). In this mode, the magnitude (absolute value) of the negative bias voltage to be applied is not particularly limited, and a voltage that enables the formation of the conductive carbon layer can be chosen. For example, the magnitude of the voltage to be applied is preferably 50 to 500 V, more preferably 100 to 300 V. Incidentally, specific modes such as other conditions in the film formation are not particularly limited, and conventionally known findings can be referred as appropriate. Meanwhile, when the conductive carbon layer 103 is formed by the UBMS process, the conductive carbon layer is preferably formed on an intermediate layer formed in advance. Thereby, a conductive carbon layer excellent in adhesiveness to the underlying layer can be formed. Nonetheless, even when the conductive carbon layer is formed by another approach, the conductive carbon layer excellent in adhesiveness to the metal base member layer can be formed even in the absence of an intermediate layer.

[Electrolyte Layer]

An electrolyte layer is constituted from, for example, the polymer electrolyte membrane 97. The polymer electrolyte membrane 97 has a function of selectively permeating protons generated at the anode catalytic layer 98a during the operation of the fuel cell into the cathode catalytic layer 98c in the film thickness direction. Additionally, the polymer electrolyte membrane 97 also has a function as a partition not to mix fuel gas supplied to the anode side with oxidant gas supplied to the cathode side.

The polymer electrolyte membrane 97 is roughly classified into a fluorinated polymer electrolyte membrane and a hydrocarbon based polymer electrolyte membrane according to the type of the ion-exchange resin that is a constituent material thereof. Examples of the ion-exchange resin constituting the fluorinated polymer electrolyte membrane include perfluorocarbon sulfonic acid based polymers such as Nafion (registered trademark, manufactured by E.I. du Pont de Nemours & Company (Inc.)), Aciplex (registered trademark, manufactured by Asahi Kasei Corporation), and Flemion (registered trademark, manufactured by Asahi Glass Co., Ltd.), perfluorocarbon phosphonic acid based polymers, trifluorostyrene sulfonic acid based polymers, ethylene tetrafluoroethylene-g-styrene sulfonic acid based polymers, ethylene-tetrafluoroethylene copolymers, polyvinylidene fluoride-perfluorocarbon sulfonic acid based polymers, and the like. From the viewpoint of improving the power generating performances such as heat resistance and chemical stability, these fluorinated polymer electrolyte membranes are preferably used, and a fluorinated polymer electrolyte membrane formed of a perfluorocarbon sulfonic acid based polymer is particularly preferably used.

Specific examples of the hydrocarbon based electrolyte include sulfonated polyethersulfone (S-PES), sulfonated polyaryletherketone, alkyl sulfonated polybenzimidazole, alkyl phosphonated polybenzimidazole, sulfonated polybenzimidazole alkyl, phosphonated polybenzimidazole alkyl, sulfonated polystyrene, sulfonated polyetheretherketone (S-PEEK), sulfonated polyphenylene (S-PPP), and the like. From the viewpoints of inexpensive raw materials, simple manufacturing steps, and a high selectivity of the materials, these hydrocarbon based polymer electrolyte membranes are preferably used. Incidentally, the above-described ion-exchange resins may be used alone or in combination of two or more kinds. In addition, the material is not limited only to the above-described materials, and other materials may be used.

The thickness of the electrolyte layer should be determined as appropriate in consideration of the properties of the fuel cell to be obtained, and is not particularly limited. The thickness of the electrolyte layer is generally approximately 5 to 300 μm. When the value of the thickness of the electrolyte layer is within such a range, the balance between the strength during the film formation, the durability during the use, and the output property during the use can be controlled properly.

[Catalytic Layer]

The catalytic layers (the anode catalytic layer 98a, the cathode catalytic layer 98c) are layers where actually cell reactions proceed. Specifically, a hydrogen oxidation reaction proceeds in the anode catalytic layer 98a, and an oxygen reduction reaction proceeds in the cathode catalytic layer 98c.

Each catalytic layer includes a catalyst component, a conductive catalyst support for supporting the catalyst component, and an electrolyte. Hereinafter, a complex of the catalyst component and the catalyst support supporting the catalyst component is also referred to as an "electrode catalyst."

The catalyst component used in the anode catalytic layer is not particularly limited, as long as it has a catalytic action for the hydrogen oxidation reaction. Known catalysts can be used similarly. In addition, the catalyst component used in the cathode catalytic layer is also not particularly limited, as long as it has a catalytic action for the oxygen reduction reaction. Known catalysts can be used similarly. Specifically, the catalyst components can be selected from metals such as platinum, ruthenium, iridium, rhodium, palladium, osmium, tungsten, lead, iron, chromium, cobalt, nickel, manganese, vanadium, molybdenum, gallium and aluminum, alloys thereof, and the like.

Among these, one containing at least platinum is preferably used to improve the catalytic activity, poisoning resistance to carbon monoxide or the like, heat resistance, and so forth. The composition of the alloy, although depending on the type of metal to be alloyed, preferably contains 30 to 90 atom % of platinum and 10 to 70 atom % of a metal alloyed with platinum. Note that the alloy is generally composed of a metal element and one or more kinds of metal element or non-metal element added thereto, and is a collective term for those having metallic properties. Examples of the constitution of the alloy include a eutectic alloy that may be called a mixture of component elements respectively forming crystals, a solid solution in which component elements are completely blended together, an intermetallic compound formed of component elements, a compound of metallic and non-metallic component elements, and the like. In the present application, any constitution may be adopted. In this case, the catalyst component used in the anode catalytic layer and the catalyst component used in the cathode catalytic layer can be selected as appropriate from the above. Unless otherwise specified herein, the same definition will be given in both the descriptions of the catalyst components for the anode catalytic layer and for the cathode catalytic layer. Accordingly, both are collectively referred to as a "catalyst component." Nevertheless, the catalyst components for the anode catalytic layer and for the cathode catalytic layer do not have to be the same. The catalyst components can be selected as appropriate so as to have desired actions as described above.

The shape and size of the catalyst component are not particularly limited, and the same shape and size as those of known catalyst components can be adopted. However, the shape of the catalyst component is preferably particulate. In this case, the average particle diameter of the catalyst particles is preferably 1 to 30 nm. When the value of the average particle diameter of the catalyst particles is within such a range, the balance between the catalyst utilization efficiency associated with the effective electrode area where the electrochemical reaction proceeds and the supporting easiness can be controlled properly. Note that, in the present invention, the "average particle diameter of catalyst particles" can be measured as a crystallite diameter obtained from a half width of a diffraction peak of the catalyst component in an X-ray diffraction, or as an average value of particle diameters of the catalyst component examined from a transmission electron microscope image.

The catalyst support functions as a support for supporting the above-described catalyst component and as an electron conduction path involved in electron transfer between the catalyst component and another member.

The catalyst support should have a specific surface area for supporting the catalyst component in a desired dispersed state and have a sufficient electron conductivity. The main component thereof is preferably carbon. Specific examples thereof include carbon particles formed of carbon black, activated carbon, coke, natural graphite, artificial graphite, and the like. Note that the phrase "main component is carbon" means that carbon atoms are contained as the main component, and is a concept including both that the main component is composed of only carbon atoms and that the main component is substantially composed of carbon atoms. Depending on cases, an element other than the carbon atoms may be contained to enhance the properties of the fuel cell. Note that the phrase "substantially composed of carbon atoms" means that the inclusion of an impurity by approximately 2 to 3% by mass or less is acceptable.

With respect to the BET specific surface area of the catalyst support, the specific surface area should be sufficient to support the catalyst component in a highly dispersed state, and is preferably 20 to 1600 $m^2/g$, more preferably 80 to 1200 $m^2/g$. When the value of the specific surface area of the catalyst support is within such a range, the balance between the dispersibility of the catalyst component on the catalyst support and the effective utilization efficiency of the catalyst component can be controlled properly.

The size of the catalyst support is not particularly limited. However, from the viewpoints of supporting easiness, catalyst utilization efficiency, controlling the thickness of the catalytic layer in a proper range, and the like, the average particle diameter should be approximately 5 to 200 nm, preferably approximately 10 to 100 nm.

In the electrode catalyst of the catalyst support and the catalyst component supported thereon, the amount of the catalyst component supported is preferably 10 to 80% by mass, more preferably 30 to 70% by mass, relative to the total amount of the electrode catalyst. When the value of the amount of the catalyst component supported is within such a range, the balance between the catalytic performance of the catalyst component on the catalyst support and the dispersibility can be controlled properly. Note that the amount of the catalyst component supported in the electrode catalyst can be measured by inductively coupled plasma spectrometry (ICP).

The catalytic layer includes an ion conductive polymer electrolyte in addition to the electrode catalyst. The polymer electrolyte is not particularly limited, and conventionally known findings can be referred as appropriate. For example, the above-described ion-exchange resin constituting the electrolyte layer may be added as the polymer electrolyte to the catalytic layer.

[Gas Diffusion Layer]

The gas diffusion layers (the anode gas diffusion layer 99a, the cathode gas diffusion layer 99c) have a function of promoting diffusion of gas (fuel gas or oxidant gas) supplied through the gas flow path 96a or 96c of the separator to the catalytic layers 98a and 98c, and a function as an electron conduction path.

The material for the base members of the gas diffusion layers 99a and 99c is not particularly limited, and conventionally known findings can be referred as appropriate. Examples thereof include sheet-shaped materials having conductive property and porosity, such as carbon-made fabric, final paper product, felt, and nonwoven fabric. The thickness of the base member should be determined as appropriate in consideration of the properties of the gas diffusion layer to be obtained. However, the thickness should be approximately 30 to 500 μm. When the value of the thickness of the base member is within such a range, the balance between the mechanical strength and the diffuseness of gas, water, and the like can be controlled properly.

The gas diffusion layer preferably includes a water repellent in order to further increase the water repellency, thus preventing a flooding phenomenon or the like. The water repellent is not particularly limited. Examples thereof include fluorinated polymer materials such as polytetrafluoroethylene (PTFE), polyvinylidene fluoride (PVdF), polyhexafluoropropylene, and tetrafluoroethylene-hexafluoropropylene copolymers (FEP), polypropylene, polyethylene, and the like.

Meanwhile, to further enhance the water repellency, the gas diffusion layer may have a carbon particle layer (microporous layer; MPL, unillustrated) on the catalytic layer side of the base member. The carbon particle layer is an assembly of carbon particles containing a water repellent.

The carbon particles included in the carbon particle layer are not particularly limited, and conventionally known materials such as carbon blacks, graphites and expanded graphites can be employed as appropriate. Above all, having an excellent electron conductivity and a large specific surface area, carbon blacks such as oil furnace black, channel black, lamp black, thermal black, acetylene black can be preferably used. The average particle diameter of the carbon particles should be approximately 10 to 100 nm. Thereby, a high drainage capacity is obtained due to a capillary force, and contacting with the catalytic layer can also be improved.

The water repellent used in the carbon particle layer may be the same as the above-described water repellent. Above all, being excellent in water repellency, the corrosion resistance during the electrode reaction, and the like, a fluorinated polymer material can be preferably used.

The mixing ratio between the carbon particles and the water repellent in the carbon particle layer should be approximately 90:10 to 40:60 (carbon particle:water repellent) in terms of mass ratio in consideration of the balance between the water repellency and the electron conductivity. Note that the thickness of the carbon particle layer is also not particularly limited, and should be determined as appropriate in consideration of the water repellency of the gas diffusion layer to be obtained.

[Seal Member]

The seal member is not particularly limited. For example, a thermosetting resin can be employed. As the thermosetting resin, it is possible to use, for example, an olefin resin, a urethane resin, a silicone resin, a phenol resin, an epoxy resin, an unsaturated polyester, or the like.

The method for producing the fuel cell is not particularly limited, and conventionally known findings in the field of fuel cells can be referred as appropriate.

The fuel used during the operation of the fuel cell is not particularly limited. For example, hydrogen, methanol, ethanol, 1-propanol, 2-propanol, 1-butanol, secondary butanol, tertiary butanol, dimethyl ether, diethyl ether, ethylene glycol, diethylene glycol, or the like can be used. Above all, in view of achievable high output, hydrogen or methanol is preferably used.

Further, to enable the fuel cell to produce a desired voltage, a fuel cell stack may be formed, the fuel cell stack having a structure in which the multiple membrane electrode assemblies are stacked and connected in series with the separators interposed therebetween. The shape and the like of the fuel cell are not particularly limited, and should be determined as appropriate so as to obtain desired cell properties such as voltage.

In the sealing structure according to the ninth embodiment, the conductive carbon layer 103 (hard carbon film) is formed in the separator 95. Thereby, the first seal member 104 makes the hard carbon film and the resin member (electrolyte membrane supporter) closely adhere to each other, the second seal member 105 makes the hard carbon films closely adhere to each other, and the third seal member 106 makes the resin members closely adhere to each other. Generally, when components made of multiple different materials closely adhere to each other, closely adhering portions differ from each other in adhesiveness (sealing performance) due to the difference in the surface properties of the materials. By contrast, in this embodiment, the conductive carbon layer 103 (hard carbon film) having higher adhesiveness to the seal member than a resin member in a general sense is formed at least in the separator 95. Thereby, even if the same sealing material is employed for the first to the third seal members 104, 105, 106, high adhesiveness can be provided to the seal members 104, 105, 106. In other words, the selection of the sealing material in accordance with the material of the electrolyte membrane supporter 90 having no hard carbon film formed thereon can lead to high adhesiveness of the first to the third seal members 104, 105, 106 even if the same sealing material is employed for all the seal members 104, 105, 106.

Moreover, the use of the conductive carbon layer 103 as the hard carbon film of the separator 95 can ensure the corrosion resistance and the conductive property of the separator 95. Thus, it is no longer necessary to form a hard carbon film only for improving the adhesiveness to the seal members 104 and 105.

Note that, in the fuel cell 90 in the form shown in FIG. 17, the separator 95 is molded in the recessed and protruding shape by performing press working on a plate-shaped conductive member (base member). Thus, by performing press working on a separator base member having a hard carbon film formed in advance to thus form cracks in a sealing surface as in the seventh embodiment (see FIG. 10), the adhesiveness to the seal members 104 and 105 can be further improved by an increased surface area and an anchoring effect.

Tenth Embodiment

Figure 18:
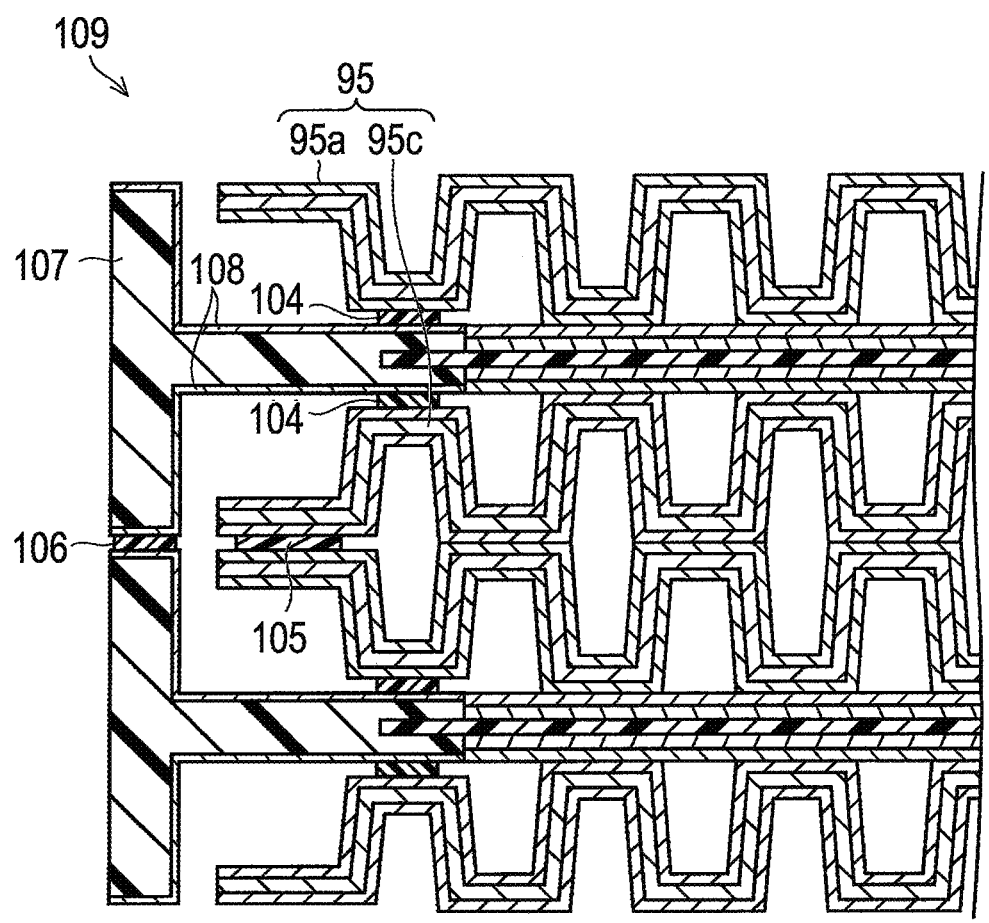
FIG. 18 is a cross-sectional view showing a sealing structure of a polymer electrolyte fuel cell according to a tenth embodiment.

FIG. 18 is a cross-sectional view showing a sealing structure of a polymer electrolyte fuel cell (PEFC) according to a tenth embodiment of the present invention.

A fuel cell 109 according to the tenth embodiment has substantially the same configuration as that of the fuel cell 90 according to the ninth embodiment, but differs only in a configuration that a hard carbon film 108 is formed on an electrolyte membrane supporter 107. Note that since electrolyte membrane supporter 107 is not required to have a conductive property, the hard carbon film 108 formed is desirably nonconductive.

In the sealing structure according to the tenth embodiment, all the first to the third seal members 104, 105, 106 make hard carbon films closely adhere to each other. Thus, regardless of the material of the base members covered with the hard carbon films, the same sealing material can be employed for the first to the third seal members 104, 105, 106 to provide high adhesiveness to all the seal members.

Eleventh Embodiment

Figure 19:
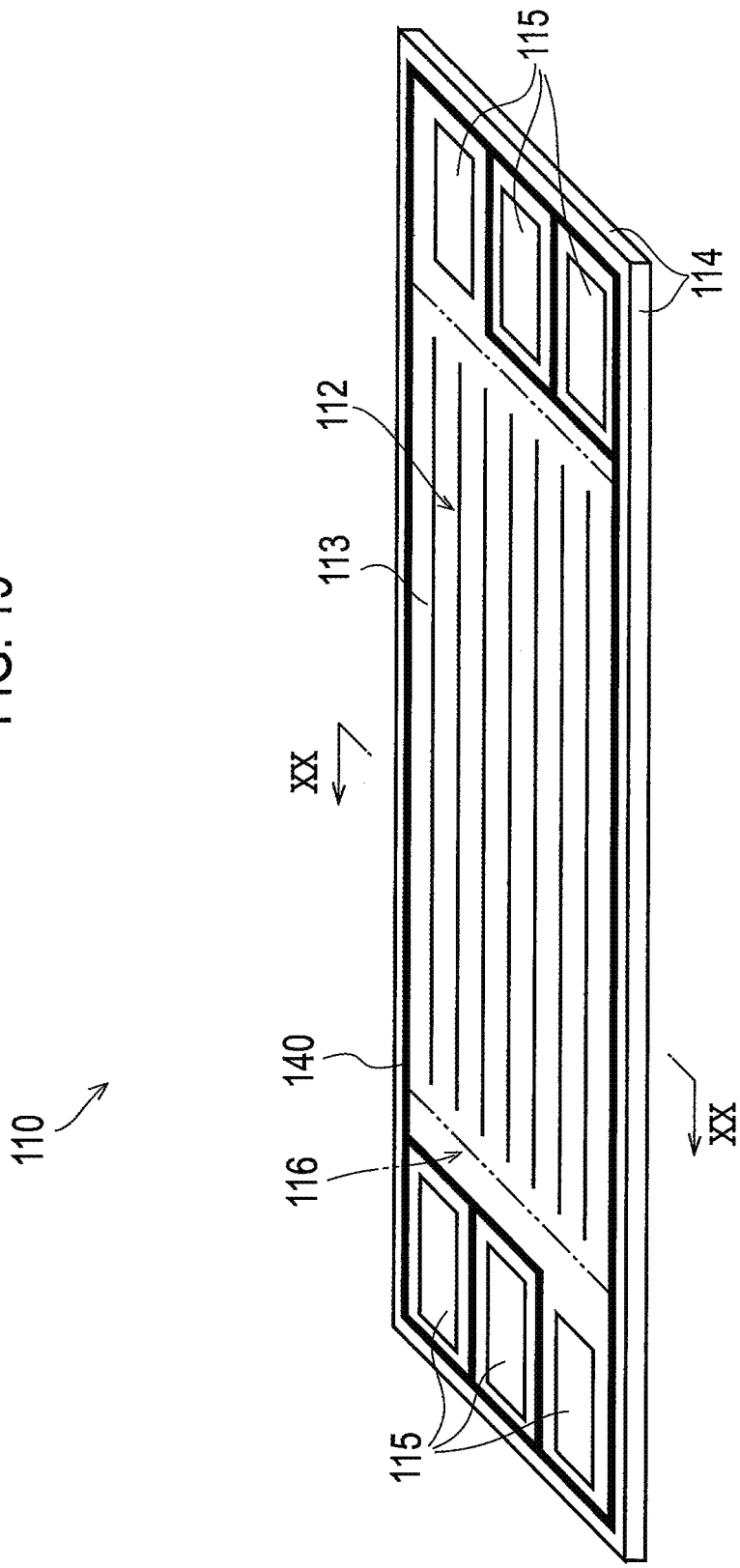
FIG. 19 is a perspective view of a fuel cell separator according to an eleventh embodiment.
Figure 20:
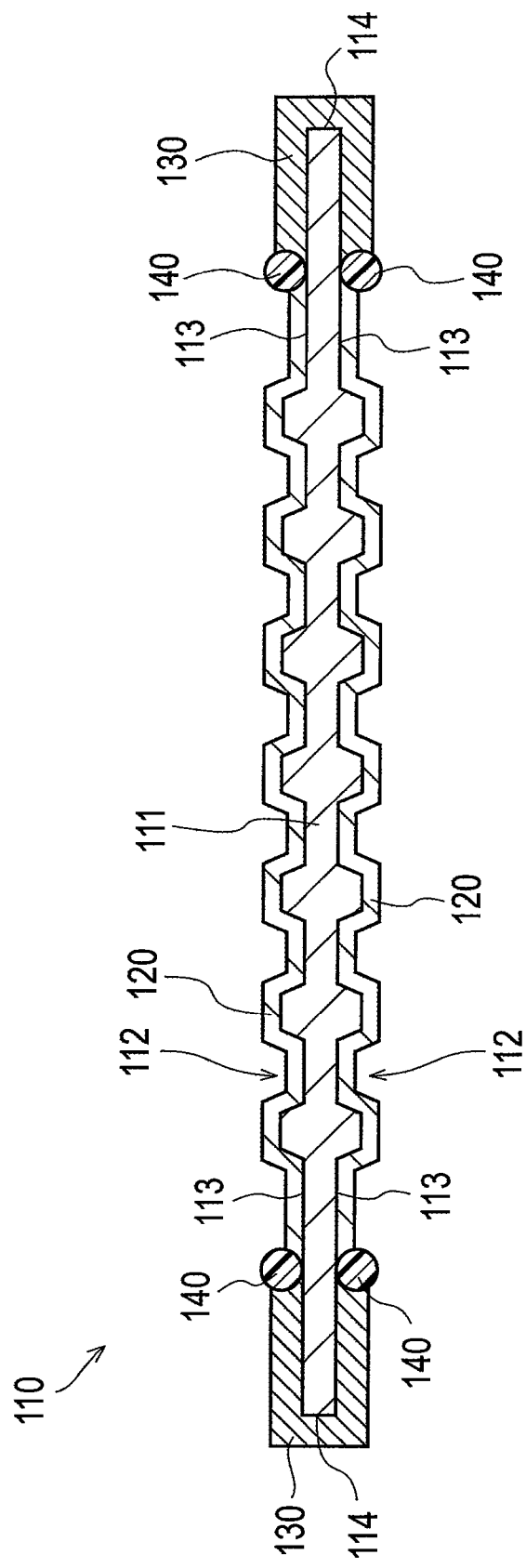
FIG. 20 is a cross-sectional view taken along the line XX-XX in FIG. 19.
Figure 21:
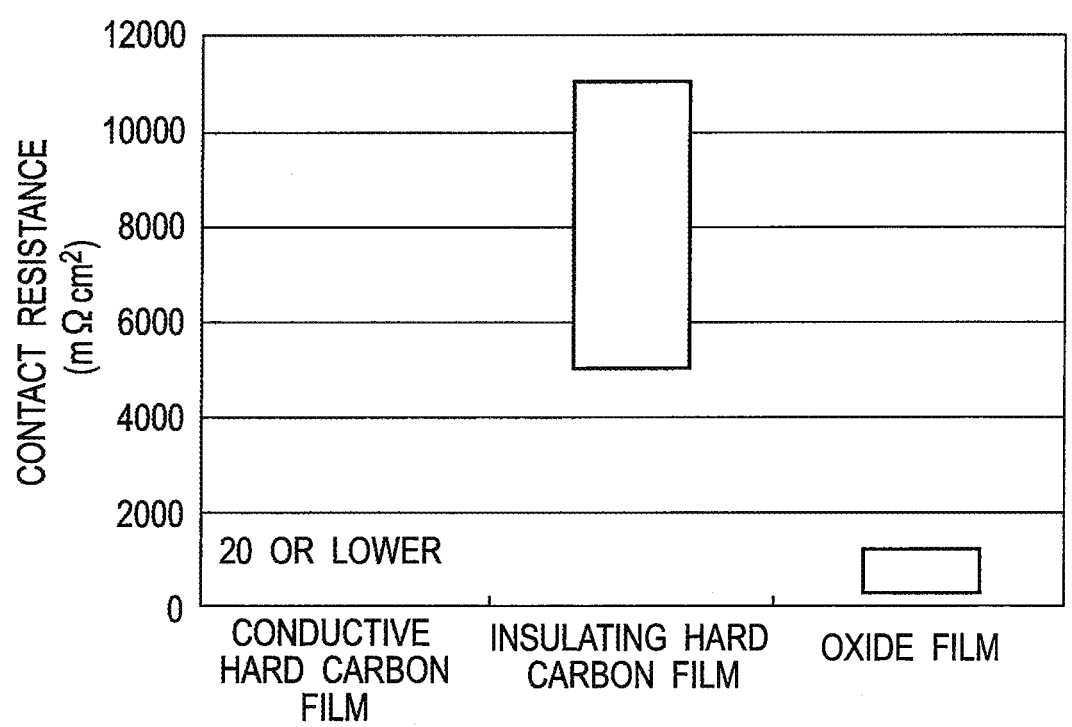
FIG. 21 is a graph illustrating the contact resistance of a hard carbon film.

FIG. 19 is a perspective view of a fuel cell separator according to an eleventh embodiment. FIG. 20 is a cross-sectional view taken along the line XX-XX in FIG. 19. FIG. 21 is a graph illustrating contact resistance.

As shown in FIGS. 19 and 20, a fuel cell separator 110 has a flat base member 111. The base member 111 has: a surface 113 (first surface) extending in a plane direction of the base member 111; and a peripheral edge surface 114 extending in a thickness direction of the base member 111 from a peripheral edge of the surface 113. In the surface 113, formed are: manifold openings 115 each for allowing fuel gas, oxidant gas or cooling water to flow therethrough; and flow path grooves 112 for forming flow paths communicating with the manifold openings 115. The fuel gas is for example hydrogen or methanol. The oxidant gas is for example air.

The surfaces of the flow path grooves 112 are covered with a conductive hard carbon film 120 having a conductive property. In this embodiment, an active area 116 of the surface 113 is covered with the conductive hard carbon film 120. The active area 116 is a region on the surface 113 including the flow path grooves 112. When the separator 110 is stacked on a membrane electrode assembly (unillustrated), the region faces and comes into contact with a region of the membrane electrode assembly where an electrochemical reaction proceeds.

The separator 110 further has an insulating hard carbon film 130 having an insulative property. The insulating hard carbon film 130 covers the peripheral edge surface 114 of the base member 111 and a region around the region of the surface 113 covered with the conductive hard carbon film 120. A seal member 140 is disposed on the surface 113 in such a manner as to surround the region covered with the conductive hard carbon film 120. The insulating hard carbon film 130 covers the peripheral edge surface 114 and a region from the peripheral edge of the surface 113 to the seal member 140. A peripheral edge portion, in a plane direction, of the conductive hard carbon film 120 is in contact with the seal member 140. Note that the seal member 140 is disposed on the surface 113 in such a manner as to surround peripheries of the flow path grooves 112 and the manifold openings 115 communicating with the flow path grooves 112 and a periphery of the other manifold openings 115.

The base member 111 is made of a metal, and contributes to ensuring the conductive property and the mechanical strength. The metal for forming the base member 111 is not particularly limited, and known metals can be used as appropriate. Examples of the constituent material of the base member 111 include iron, titanium, aluminum, and alloys thereof.

The conductive hard carbon film 120 is a film containing conductive carbon. The conductive hard carbon film 120 is specified by a strength ratio R (ID/IG) of a D-band peak strength (ID) to a G-band peak strength (IG) measured by Raman scattering spectroscopic analysis. In this embodiment, the strength ratio R (ID/IG) is 1.3 or higher.

Further, in a preferred embodiment, the R is preferably 1.4 to 2.0, more preferably 1.4 to 1.9, and further preferably 1.5 to 1.8. When the R value is 1.3 or higher, the conductive hard carbon film 120 having a conductive property in the stacking direction sufficiently ensured is obtained. In addition, when the R value is 2.0 or lower, a decrease in the graphite component can be suppressed. Further, an increase in the internal stress of the conductive hard carbon film 120 itself can also be suppressed, and the adhesiveness to the underlying base member 111 can be further improved.

The conductive hard carbon film 120 has a polycrystalline graphite structure. The "polycrystalline graphite" microscopically has an anisotropic graphite crystal structure (graphite cluster) in which graphene planes (hexagonal net planes) are stacked one above the other, and is macroscopically isotropic crystal body that is an assembly of the multiple graphite structures. Hence, it can be said that the polycrystalline graphite is a type of diamond-like carbon (DLC; Diamond-Like Carbon).

The conductive hard carbon film 120 may be formed only of a polycrystalline graphite, but the conductive hard carbon film 120 may also contain a material other than the polycrystalline graphite. Examples of the carbon material other than the polycrystalline graphite, which may be contained in the conductive hard carbon film 120, include carbon blacks, fullerenes, carbon nanotubes, carbon nanofibers, carbon nanohorns, carbon fibrils, and the like.

The insulating hard carbon film 130 is a carbon film containing an insulating carbon and excellent in insulative property. The insulating hard carbon film 130 is for example a carbon film having a diamond-like crystal structure or a carbon film containing hydrogen. The thickness of the insulating carbon layer 130 is not particularly limited. However, the thickness is preferably 1 to 1000 nm, more preferably 2 to 500 nm, and further preferably 5 to 200 nm. When the value of the thickness of the insulating carbon layer is within this range, sufficient insulation can be ensured. Additionally, it is possible to achieve such an advantageous effect of a higher corrosion resistance provided to the metal base member layer.

FIG. 21 is a graph illustrating the contact resistance of the hard carbon film under a condition where the contact surface pressure was at 1 MPa. As shown in FIG. 21, while the contact resistance of the oxide film formed as a result of the acid cleaning process was 100 to 1000 m$\Omega \cdot$cm$^2$, the contact resistance of the insulating hard carbon film 130 was 5000 to 11000 m$\Omega \cdot$cm$^2$. Thus, the insulating hard carbon film 130 has an excellent insulative property in comparison with the oxide film. Note that the contact resistance of the conductive hard carbon film 120 was 20 m$\Omega \cdot$cm$^2$ or lower.

The fuel cell separator has functions of electrically connecting the single cells to each other and also allowing fuel gas or oxidant gas to flow into the fuel cell stack. For this reason, the fuel cell separator is preferably excellent in both conductive property and corrosion resistance.

However, with respect to a conventional fuel cell separator, when the separator is cooled by cooling water, a periphery portion comes into contact with outside air, so that condensation occurs in some cases. Water formed due to the condensation may electrically connect the separator to another device or another article. Further, the same problem occurs when water flowing in the separator, water generated within the fuel cell stack, or the like is attached to a peripheral portion of the separator. Particularly, due to the configuration, the peripheral portion of the separator is likely to come into contact with another device and the like. Accordingly, electrical connection through attached water or electrical connection through direct contact may be established in some cases.

When a passivation film is formed on the surface of the peripheral portion, insulation can be achieved to some degree, but the insulation was not sufficient as described using FIG. 21.

In the separator 110 of the eleventh embodiment, the insulating hard carbon film 130 demonstrating an excellent insulative property in comparison with, for example, an oxide film covers the peripheral edge surface 114 of the base member 111. Thus, even when, for example, water is attached to the peripheral portion of the separator 110, the separator 110 is capable of inhibiting the electrical connection to another article, device, or the like because of the insulating hard carbon film 130, and has an excellent insulative property. Moreover, since the insulation at the peripheral portion is favorable, it is no longer necessary to additionally provide, for example, an insulating cover or the like, and a reduction in device size or cost can be achieved.

Since having the conductive hard carbon film 120, the separator 110 has a high corrosion resistance in comparison with a case of the base member 111 alone, while ensuring the conductive property.

In the separator 110, the insulating hard carbon film 130 covers not only the peripheral edge surface 114 of the base member 111 but also the region around the region of the surface 113 covered with the conductive hard carbon film 120. In this embodiment, the insulating hard carbon film 130 covers not only the peripheral edge surface 114 but also the region from the peripheral edge of the surface 113 to the seal member 140. Thereby, for example, the electrical connection between water formed due to condensation at the peripheral portion of the separator 110 and the base member 111 through the surface 113 is prevented. Thus, the insulative property is further improved in comparison with a case where the insulating hard carbon film 130 covers only the peripheral edge surface 114.

Twelfth Embodiment

Figure 22:
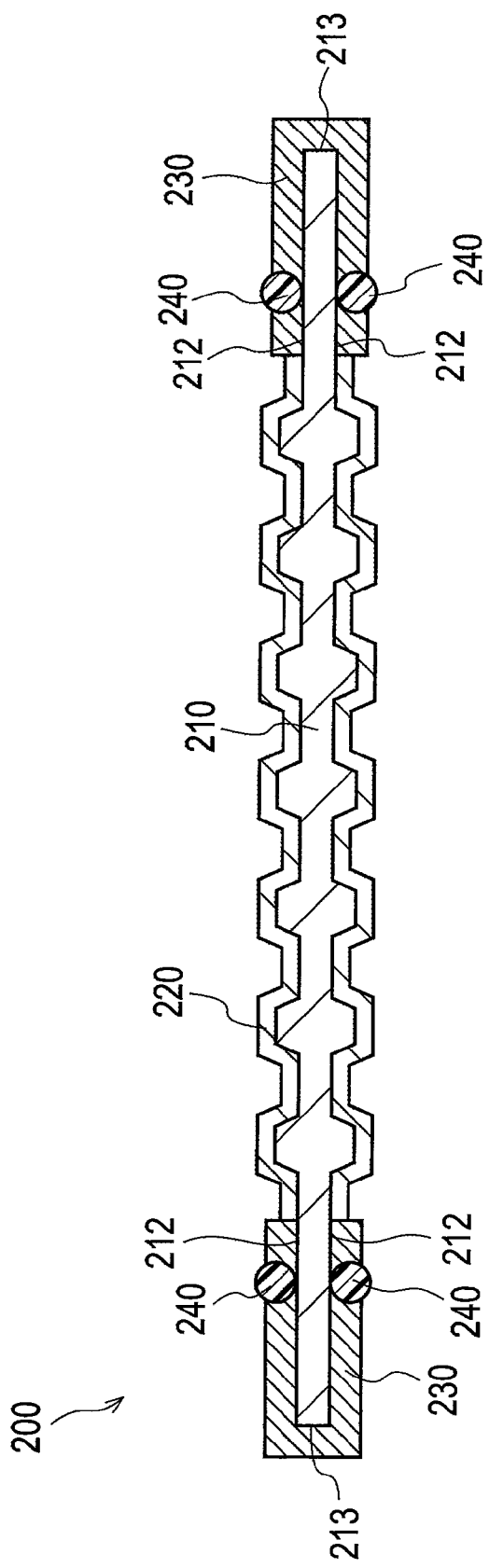
FIG. 22 is a cross-sectional view of a fuel cell separator of a twelfth embodiment.

FIG. 22 is a cross-sectional view of a fuel cell separator of a twelfth embodiment.

As shown in FIG. 22, a fuel cell separator 200 of the twelfth embodiment is substantially the same as that of the eleventh embodiment. However, a region of a base member 210 covered with an insulating hard carbon film 230 in this embodiment is different from that in the eleventh embodiment.

In the separator 200, the insulating hard carbon film 230 covers a peripheral edge surface 213, a region from a peripheral edge of a surface 212 (first surface) to a seal member 240, and a region from the seal member 240 on the surface 212 to a peripheral edge portion of a conductive hard carbon film 220. In other words, a boundary between the conductive hard carbon film 220 and the insulating hard carbon film 230 is located inwardly of the seal member 240.

With such a configuration of the twelfth embodiment, insulation is ensured not only outside the seal member 240 but also inside the seal member 240. In addition to the effects of the eleventh embodiment, an effect that the insulative property can be further improved is achieved.

Modified Example of Twelfth Embodiment

Figure 23:
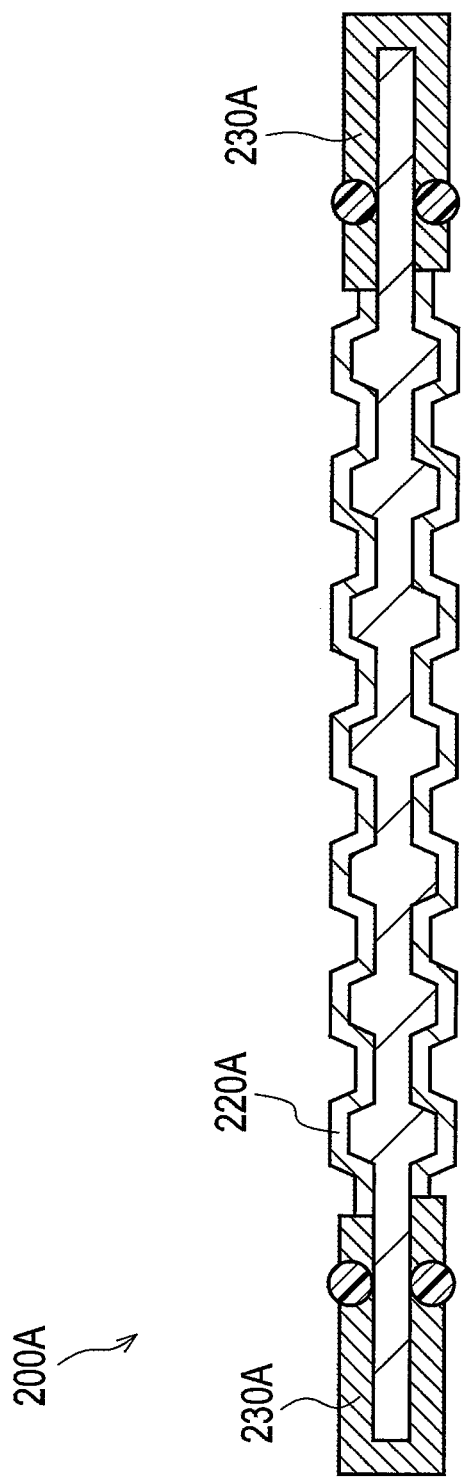
FIG. 23 is a cross-sectional view of a fuel cell separator according to a modified example of the twelfth embodiment.

FIG. 23 is a cross-sectional view of a fuel cell separator according to a modified example of the twelfth embodiment.

As shown in FIG. 23, the position of a boundary between a region covered with an insulating hard carbon film 230A and a region covered with a conductive hard carbon film 220A may be shifted in a plane direction on one surface of a separator 200A from the other surface thereof.

Thirteenth Embodiment

Figure 24:
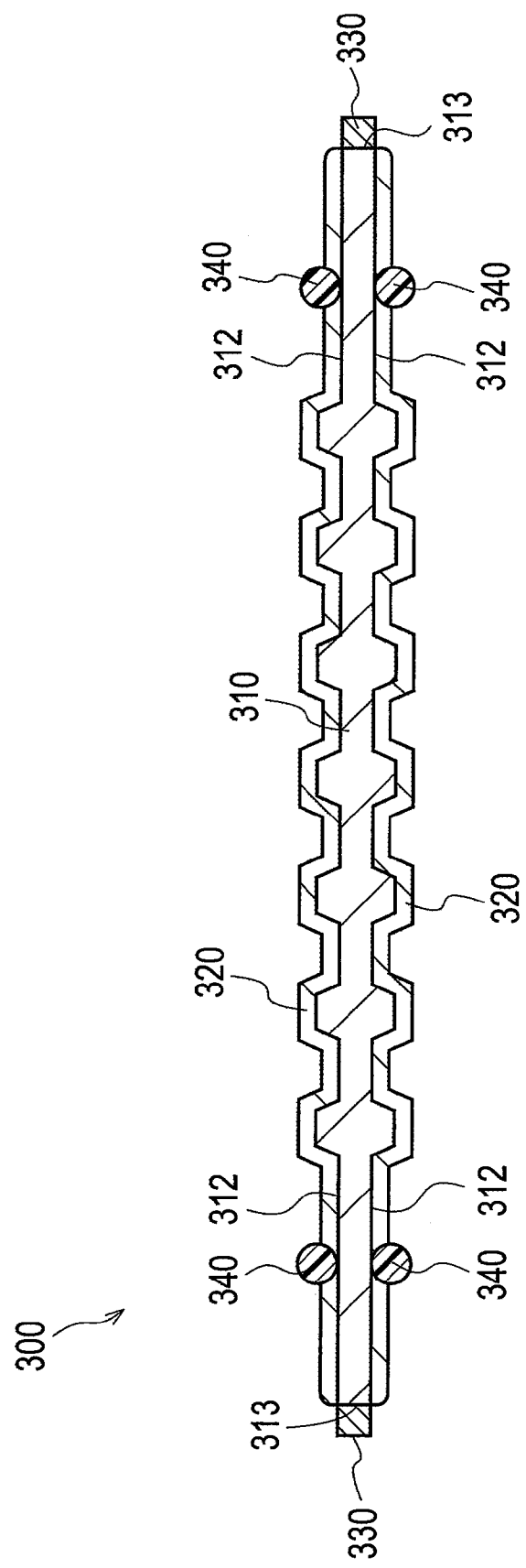
FIG. 24 is a cross-sectional view of a fuel cell separator of a thirteenth embodiment.

FIG. 24 is cross-sectional view of a fuel cell separator of a thirteenth embodiment.

As shown in FIG. 24, a separator 300 of the thirteenth embodiment is substantially the same as that of the eleventh embodiment. However, this embodiment is different from the eleventh embodiment in a region of a base member 310 covered with an insulating hard carbon film 330 and a region of the base member 310 covered with a conductive hard carbon film 320. In the separator 300, the insulating hard carbon film 330 covers only a peripheral edge surface 313, while the conductive hard carbon film 320 covers a surface 312 (first surface) entirely.

With such a configuration of the thirteenth embodiment, substantially the same effects as those in the eleventh embodiment are achieved. Further, in the thirteenth embodiment, since the insulating hard carbon film 330 does not cover the surface 312, the time of forming the insulating hard carbon film 330 can be shortened in comparison with the eleventh embodiment.

Note that, in the eleventh to the thirteenth embodiments, the descriptions have been given of the cases where the insulating hard carbon film and the conductive hard carbon film are formed so as not to overlap each other. Nevertheless, the insulating hard carbon film may be formed to overlap the conductive hard carbon film. For example, after the conductive hard carbon film is formed on the entire surface 113 of the base member 111, the insulating hard carbon film 130 may be formed so as to overlap a region of the conductive hard carbon film where insulation is needed.

<Fuel Cell Stack>

Figure 25:
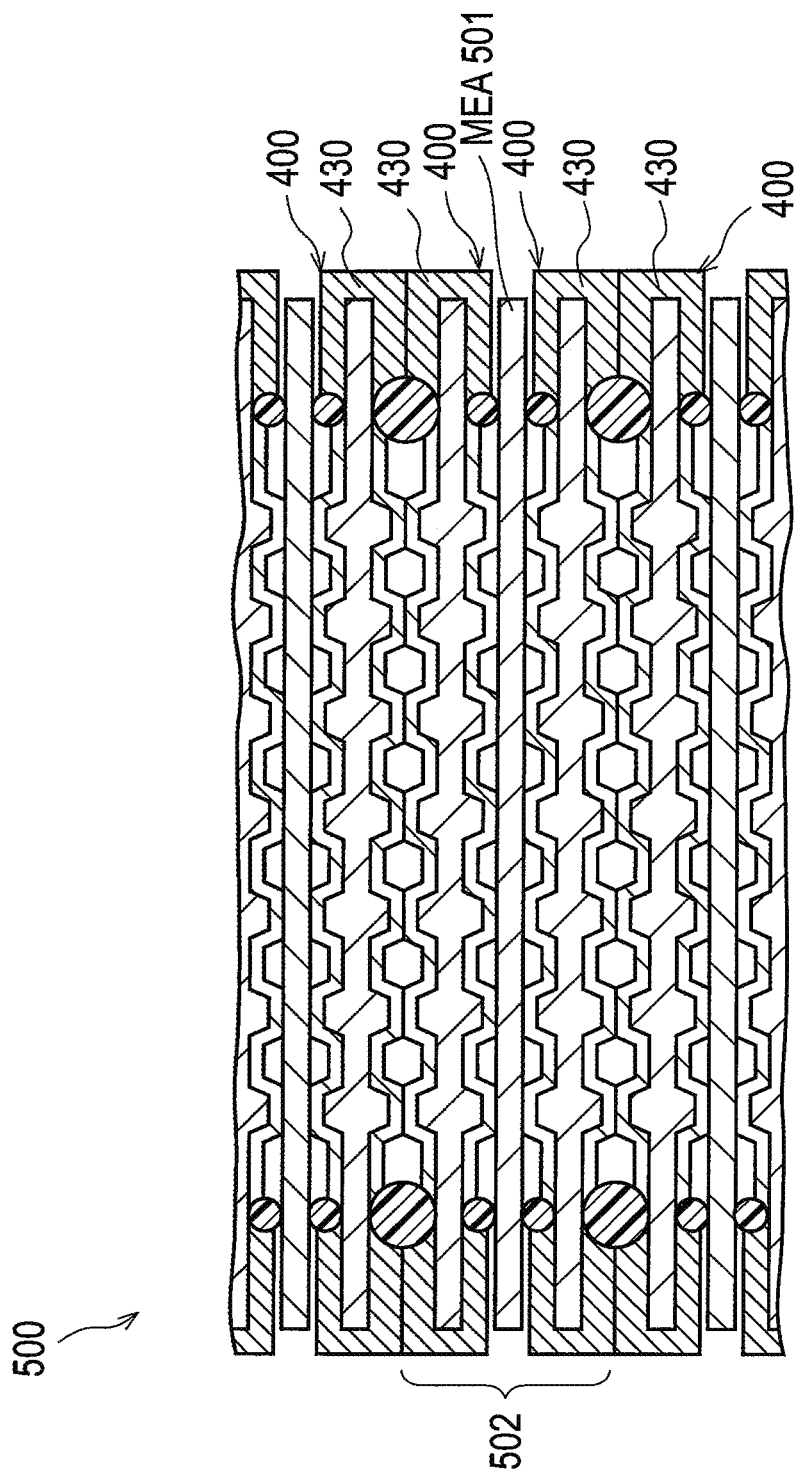
FIG. 25 is a schematic cross-sectional view of a fuel cell stack according to the eleventh to the thirteenth embodiments.

FIG. 25 is a schematic cross-sectional view of a fuel cell stack.

As shown in FIG. 25, a fuel cell stack 500 has a structure in which multiple single cells 502 having a power generating function are stacked one above the other. Each of the single cells 502 has a membrane electrode assembly 501 for an electrochemical reaction to proceed and a pair of separators 400 sandwiching the membrane electrode assembly 501 therebetween. The separators 400 each have the same configuration as that in the eleventh embodiment. Incidentally, the separator 400 may have the same configuration as that in the twelfth embodiment.

The fuel cell stack 500 has a configuration in which the separators 400 lie on each other at portions where the single cells 502 are in contact with each other. Between these separators 400 lying on each other, insulating hard carbon films 430 are in contact with each other.

Since the fuel cell stack 500 has the separators 400 each having the same configuration as that of the separator of the eleventh embodiment or the twelfth embodiment, the same effects as in these embodiments are achieved. Further, since the insulating hard carbon films 430 are in contact with each other between the separators 400 lying on each other, intrusion of water is suppressed, and insulation can be ensured inside and outside the fuel cell stack 500.

<Method for Producing Fuel Cell Separator>

Figure 26:
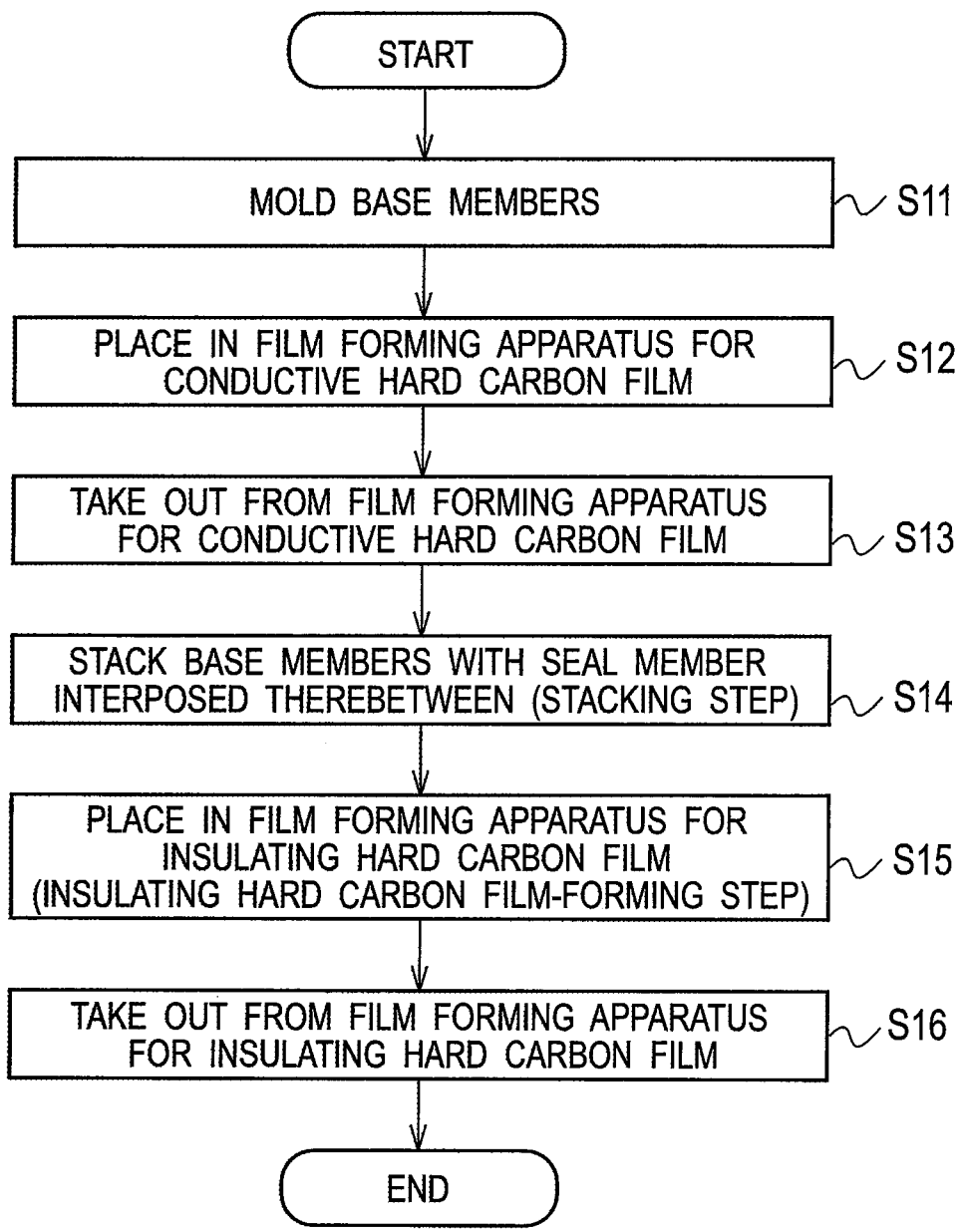
FIG. 26 is a flowchart illustrating a method for producing a fuel cell separator.
Figure 27:
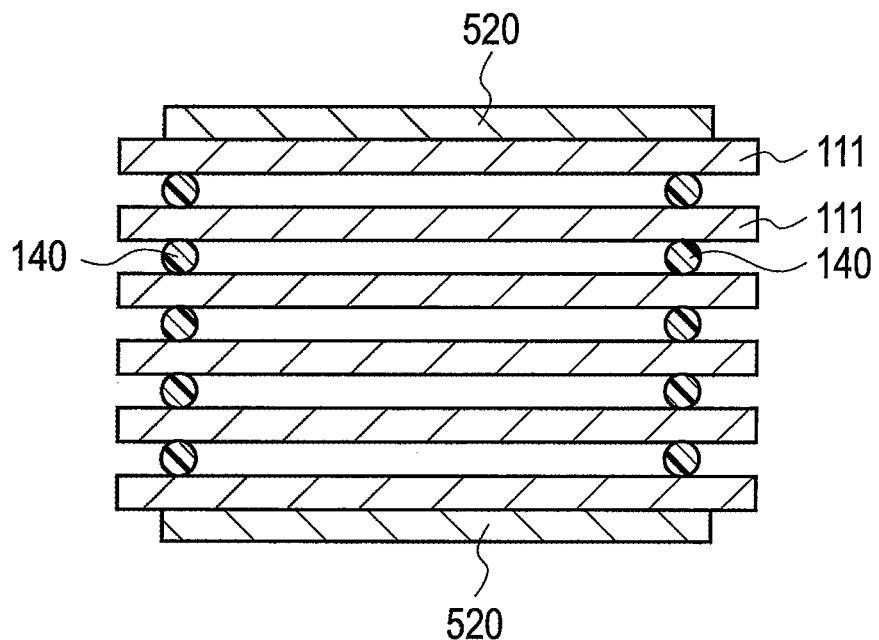
FIG. 27 is a cross-sectional view for explaining how base members are stacked.
Figure 28:
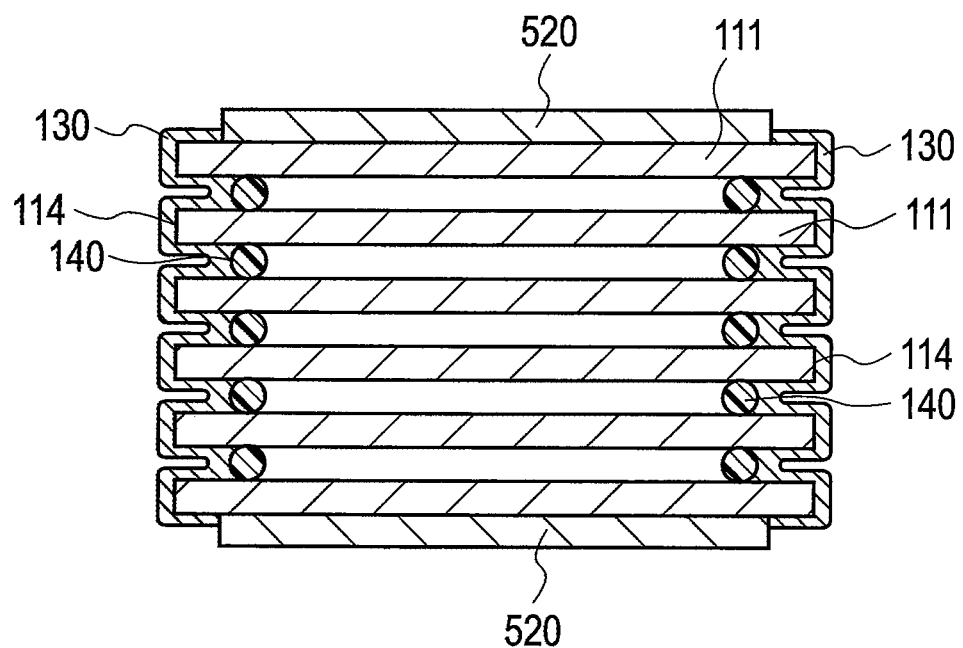
FIG. 28 is a cross-sectional view with an insulating hard carbon film being formed.

FIG. 26 is a flowchart illustrating a method for producing a fuel cell separator. FIG. 27 is a cross-sectional view for explaining how base members are stacked. FIG. 28 is a cross-sectional view with an insulating hard carbon film being formed. In the drawings referred in the following description, some of the above-described members are shown in simplified forms.

As illustrated in FIG. 26, in the method for producing the fuel cell separator 110, first, the base members 111 are molded (S11). Then, the base members 111 are placed in a film forming apparatus for conductive hard carbon film, and the conductive hard carbon films 120 are formed (S12). Next, the base members 111 are taken out (S13), and the base members 111 each having a buffer member disposed on the surface 113 are stacked one above the other with the buffer member interposed therebetween (stacking step: S14). The stacked base members 111 (stack) are placed in a film forming apparatus for insulating hard carbon film, and the insulating hard carbon film is formed (insulating hard carbon film-forming step: S15). Thereafter, the stack is taken out (S16).

In molding the base member 111, for example, a plate member made of a metal such as a stainless steel or titanium is pressed and thus molded to the base member 111 having a predetermined shape.

In forming the conductive hard carbon film 120, the base member 111 is subjected to ultrasonic cleaning in ethanol as a pretreatment. Then, the base member 111 is placed in a vacuum chamber and subjected to an ion bombardment process with Ar gas to remove an oxide film and impurities on the surface. By an unbalanced magnetron sputtering (UBMS) process using Cr as a target, Cr films are formed on both surfaces of the base member 111. Further, by the UBMS process using a solid graphite as a target, the conductive hard carbon films 120 are formed at required spots on both the surfaces of the base member 111, while a negative bias voltage at 110 V is being applied to the base member 111.

As shown in FIG. 27, when the base members 111 are stacked, the base members 111 are stacked with the buffer member interposed between the stacked members. In the stacking, the buffer member is disposed on the surface 113 in such a manner as to surround the flow path grooves 112; in addition, covers 520 for covering the flow path grooves 112 are disposed on the outer surfaces 113 of the base members 111 positioned at both ends in the stacking direction between the multiple base members 111 thus stacked. The cover 20 may be either a resin film or a metallic plate, as long as the cover can mask the flow path grooves 112. In this embodiment, the seal member 140 is used as the buffer member.

Forming the insulating hard carbon film 130 is the same as the forming the conductive hard carbon film 120 from the pretreatment to the formation of Cr films. In forming the insulating hard carbon film 130, for example, using benzene or hydrocarbon gas such as methane gas as the raw material, a plasma is created by high-frequency discharge in a vacuum chamber, and carbon and hydrogen are deposited on the base member 111 by the plasma CVD process.

As shown in FIG. 28, in forming the insulating hard carbon film 130, the insulating hard carbon film 130 is formed on the peripheral edge surface 114 and on the region from the peripheral edge of the surface 113 to the seal member 140.

Incidentally, the insulating hard carbon film 130 may be formed to overlap the conductive hard carbon film 120. Specifically, the insulating hard carbon film may be formed in S15 so as to overlap a region of the conductive hard carbon film where insulation is needed, the conductive hard carbon film having been formed on the entire surface of the surface 113 of the base member 111 in S12.

The effects of the method for producing the separator 110 will be described.

In the above-described method for producing the separator 110, the insulating hard carbon film 130 is formed on the peripheral edge surface 114 of the base member 111 and on the region from the peripheral edge of the surface 113 to the seal member 140. Thus, the separator 110 thus produced has the operational effects described in the eleventh embodiment. The method for producing a fuel cell separator of the present invention can provide a fuel cell separator having an excellent insulative property.

In addition, in the method for producing a separator, the insulating film 130 is formed with the base members 111 being stacked. Accordingly, the multiple base members 111 can be formed at once, and the productivity is favorable.

Moreover, in the stack, the covers 520 cover the flow path grooves 112 formed in the outer surfaces 113 of the base members 111 positioned at both the ends in the stacking direction, while the other flow path grooves 112 are sealed by the seal members 140 (buffer members) positioned between the layers. Accordingly, the insulating hard carbon film 130 is not formed on the flow path grooves 112, but can be formed surely at required spots.

When the insulating hard carbon film 130 is formed, the seal member 140 is used as the buffer member disposed between the base member 111 and the base member 111. Accordingly, it is no longer necessary to prepare other buffer members than the seal member 140, and a reduction in cost can be achieved.

Note that the fuel cell or the fuel cell stack according to the above-described embodiments can be mounted as a driving power source in a vehicle, for example.

Figure 29:
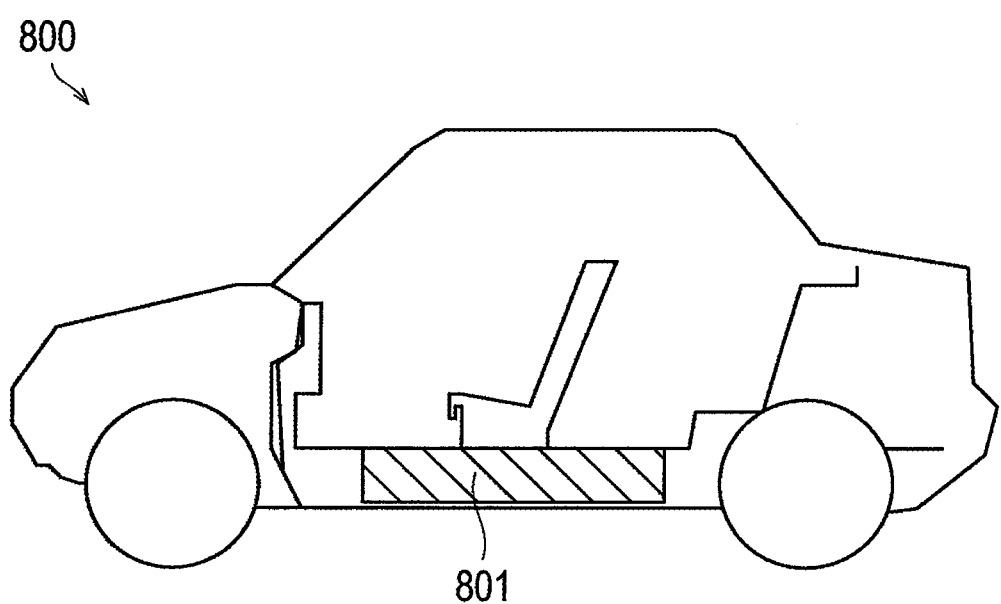
FIG. 29 is a conceptual drawing of a vehicle in which a fuel cell stack employing the present invention is mounted.

FIG. 29 is a conceptual drawing of a vehicle in which the fuel cell stack of the above-described embodiments is mounted. As shown in FIG. 29, when a fuel cell stack 801 is mounted in such a vehicle as a fuel cell vehicle 800, the fuel cell stack 801 may be mounted, for example, under a seat at a central portion of the body of the fuel cell vehicle 800. As the fuel cell stack 801 is mounted under the seat, a large space is available for the vehicle compartment space and the trunk room. Depending on the situation, the location where the fuel cell stack 801 is mounted is not limited to the location under the seat, and may be in a lower portion of the rear trunk room or in an engine room on the front side of the vehicle. The vehicle in which the fuel cell in the above-described form is mounted in this manner is also included in the technical scope of the present invention.

The above described embodiments are merely illustrative and described only to facilitate the understanding of the present invention. The present invention is not limited to these embodiments, and various modifications can be made within the technical scope of the present invention. For example, the sealing structure of the embodiments can be used not only for a fuel cell but for various usages. Moreover, when employed for a fuel cell, the sealing structure can be employed for a phosphoric acid fuel cell (PAFC), a molten carbonate fuel cell (MCFC), a solid oxide fuel cell (SOFC), an alkaline fuel cell (AFC), or the like other than PEFC.

Further, the technical scope of the present invention also includes appropriate combinations of each component of the above embodiments as well as the above embodiments. For example, the sealing structures, the fuel cell separators, the fuel cells, and the vehicle according to the first to the fifth and the ninth to the thirteenth embodiments employing the groove portions according to the sixth to the eighth embodiments are included in the technical scope of the present invention.

The present application claims priority based on Japanese Patent Application No. 2008-304983 filed on 28 Nov. 2008, and Japanese Patent Application No. 2008-305400 filed on 28 Nov. 2008, the entire contents of which are incorporated herein by reference.

INDUSTRIAL APPLICABILITY

In a sealing structure according to the present invention, a hard carbon film is formed on sealing surfaces that face and closely adhere to each other. Thus, a sealing structure having further improved adhesiveness to a seal member is provided. The sealing structure eliminates the need to consider the adhesiveness of a base member to the seal member, and the kinds of seal member are reduced to achieve cost reduction.

Moreover, a fuel cell having the sealing structure has a simple structure and is excellent in productivity, and thus can be suitably utilized for many usages, irrespective of mobile, stationary, and automobile fuel cells.

The invention claimed is:

1. A sealing structure comprising:
   a plurality of components respectively having sealing surfaces on surfaces thereof facing each other;
   a seal member interposed between the sealing surfaces to make the sealing surfaces closely adhere to each other,
   a hard carbon film and an intermediate layer formed on one or both of the sealing surfaces, the intermediate layer interposed between the hard carbon film and a base member of a corresponding component, and
   a gap formed between crystals of the intermediate layer, and the seal member enters the gap,
   wherein the seal member is provided on the hard carbon film.

2. The sealing structure according to claim 1, wherein a width of the hard carbon film formed on at least one of the sealing surfaces is larger than a width of the seal member.

3. The sealing structure according to claim 1, wherein the plurality of components have a protruding portion or a recessed portion on at least one of the surfaces facing each other, and
   the at least one of the sealing surfaces where the hard carbon film is formed is provided on a top end surface of the protruding portion or a bottom surface of the recessed portion.

4. The sealing structure according to claim 1, wherein a groove portion is formed in the at least one of the sealing surfaces where the hard carbon film is formed.

5. The sealing structure according to claim 4, wherein each of the components includes:
   the base member;
   the hard carbon film;
   the intermediate layer interposed between the base member and the hard carbon film, and
   the groove portion which includes the gap formed between crystals of the intermediate layer.

6. The sealing structure according to claim 5, wherein the intermediate layer has a columnar crystal structure, and the gap exists between columnar crystals of the intermediate layer.

7. The sealing structure according to claim 4, wherein the groove portion is a crack formed in the hard carbon film.

8. The sealing structure according to claim 1, wherein the components comprise:
   two fuel cell separators adjacent to each other; or
   a membrane electrode assembly and a fuel cell separator adjacent to the membrane electrode assembly,
   wherein each fuel cell separator has the at least one of the sealing surfaces where the hard carbon film is formed.

9. The sealing structure according to claim 1, wherein the hard carbon film formed on one or both of the sealing surfaces has a conductive property.

10. The sealing structure according to claim 1, wherein each of the components is a fuel cell separator including:
    a flat base member having a first surface extending in a plane direction and a peripheral edge surface extending in a thickness direction from a peripheral edge of the first surface; and
    an insulating hard carbon film covering at least the peripheral edge surface.

11. The sealing structure according to claim 10, wherein a flow path groove is formed in the first surface, and
    a first region of the first surface including the flow path groove is covered with a conductive hard carbon film.

12. The sealing structure according to claim 11, wherein the insulating hard carbon film covers the peripheral edge surface and a second region around the first region of the first surface covered with the conductive hard carbon film.

13. The sealing structure according to claim 11, wherein the conductive hard carbon film covers the first surface entirely.

14. The sealing structure according to claim 12, wherein the seal member is disposed on the first surface to surround a periphery of the first region covered with the conductive hard carbon film, and
    the insulating hard carbon film covers the peripheral edge surface and a region of the first surface from the peripheral edge of the first surface to the seal member.

15. A fuel cell comprising the sealing structure according to claim 1.

16. The sealing structure according to claim 1, wherein a groove portion is formed in the sealing surface where the hard carbon film is formed, the groove portion comprising a portion where the hard carbon film is not formed and further comprising the gap of the intermediate layer.

17. The sealing structure according to claim 1, wherein the intermediate layer has a columnar crystal structure grown in a film thickness direction, and
    the gap exists between columnar crystals of the intermediate layer.

18. The sealing structure according to claim 17, wherein the gap exists between lateral sides of the columnar crystals of the intermediate layer, and the seal member enters the gap.

19. A sealing structure comprising:
    a plurality of components respectively having sealing surfaces on surfaces thereof facing each other;
    a seal member interposed between the sealing surfaces to make the sealing surfaces closely adhere to each other,
    a hard carbon film and an intermediate layer formed on two sealing surfaces, the intermediate layer interposed between the hard carbon film and a base member of a corresponding component, and
    a gap formed between crystals of the intermediate layer, and the seal member enters the gap,
    wherein the seal member is sandwiched between the hard carbon films and provided thereon.

20. The sealing structure according to claim 1, wherein the intermediate layer is selected from at least one of Group 4 metals, Group 5 metals and Group 6 metals in a periodic table, carbides, nitrides, and carbonitrides thereof.

* * * * *